United States Patent
Packirisamy et al.

(10) Patent No.: US 10,816,792 B2
(45) Date of Patent: Oct. 27, 2020

(54) WAVELENGTH TUNABLE OPTICAL SOURCES, FILTERS AND DETECTORS

(71) Applicant: VALORBEC LIMITED PARTNERSHIP, Montreal (CA)

(72) Inventors: Muthukumaran Packirisamy, Pierrefonds (CA); Pierre Pottier, Montreal (CA)

(73) Assignee: Valorbec Societe En Commandite, Montreal (CA)

( * ) Notice: Subject to any disclaimer, the term of this patent is extended or adjusted under 35 U.S.C. 154(b) by 155 days.

(21) Appl. No.: 15/780,004

(22) PCT Filed: Dec. 1, 2016

(86) PCT No.: PCT/CA2016/000295
§ 371 (c)(1),
(2) Date: May 30, 2018

(87) PCT Pub. No.: WO2017/091884
PCT Pub. Date: Jun. 8, 2017

(65) Prior Publication Data
US 2018/0348507 A1 Dec. 6, 2018

Related U.S. Application Data

(60) Provisional application No. 62/261,396, filed on Dec. 1, 2015.

(51) Int. Cl.
*G02B 26/08* (2006.01)
*G02B 6/35* (2006.01)
(Continued)

(52) U.S. Cl.
CPC ............ *G02B 26/0841* (2013.01); *B81B 5/00* (2013.01); *B81B 7/02* (2013.01); *G02B 6/3534* (2013.01); *H04J 14/0215* (2013.01); *G02B 6/124* (2013.01)

(58) Field of Classification Search
CPC .... G02B 26/0841; G02B 6/3534; B81B 5/00; B81B 7/02; H04J 14/0215
See application file for complete search history.

(56) References Cited

U.S. PATENT DOCUMENTS 10,310,196 B2 * 6/2019 Hutchison .......... G02B 6/12016
2005/0083523 A1 * 4/2005 Senturia .................... G01J 3/42
356/323

(Continued)

*Primary Examiner* — Chris H Chu
(74) *Attorney, Agent, or Firm* — Rosenberg, Klein & Lee

(57) ABSTRACT

Wavelength division multiplexing (WDM) has enabled telecommunication service providers to fully exploit the transmission capacity of optical fibers. State of the art systems in long-haul networks now have aggregated capacities of terabits per second. Moreover, by providing multiple independent multi-gigabit channels, WDM technologies offer service providers with a straight forward way to build networks and expand networks to support multiple clients with different requirements. In order to reduce costs, enhance network flexibility, reduce spares, and provide re-configurability many service providers have migrated away from fixed wavelength transmitters, receivers, and transceivers, to wavelength tunable transmitters, receivers, and transceivers as well as wavelength dependent add-drop multiplexer, space switches etc. However, to meet the competing demands for improved performance, increased integration, reduced footprint, reduced power consumption, increased flexibility, re-configurability, and lower cost it is desirable to exploit/adopt monolithic optical circuit technologies, hybrid optoelectronic integration, and microelectromechanical systems (MEMS).

9 Claims, 12 Drawing Sheets

(51) Int. Cl.
*B81B 5/00* (2006.01)
*B81B 7/02* (2006.01)
*H04J 14/02* (2006.01)
*G02B 6/124* (2006.01)

(56) References Cited

U.S. PATENT DOCUMENTS

2012/0103065 A1* 5/2012 Muehleisen ............. G01J 3/18
                                                73/24.02
2017/0017042 A1* 1/2017 Menard ............... H01S 5/02216

* cited by examiner

WAVELENGTH TUNABLE OPTICAL SOURCES, FILTERS AND DETECTORS

CROSS-REFERENCE TO RELATED APPLICATIONS

This patent application claims the benefit of priority as a 371 National Phase entry application from PCT/CA2016/000,295 filed on Dec. 1, 2016 entitled "Wavelength Tunable Optical Sources, Filters and Detectors", which itself claims the benefit of priority from U.S. Provisional Patent Application 62/261,396 filed on Dec. 1, 2015 entitled "Wavelength Tunable Optical Sources, Filters and Detectors" the entire contents of each being incorporated herein by reference.

FIELD OF THE INVENTION

This invention relates to microoptoelectromechanical systems (MOEMS) and more particular to designs for optical microelectromechanical systems (MEMS) based wavelength tunable components such as sources, filters, and detectors exploiting such optical MEMS elements.

BACKGROUND OF THE INVENTION

Dense wavelength division multiplexing (DWDM) and coarse wavelength division multiplexing (CWDM) have enabled telecommunication service providers to fully exploit the transmission capacity of optical fibers within their networks. Wavelength division multiplexing (WDM) technologies offer service providers not only increased transmission capacity on each fiber but also with flexible and non-intrusive means to expand their networks to support evolving requirements. At the same time WDM has evolved from long haul and ultra-long haul networks to penetrate down into access networks, local area networks and data centers in order to support the continuing inexorable demand for data.

Accordingly, today networks may exploit dynamically configurable wavelength tunable transmitters, receivers, and transceivers as well as wavelength dependent add-drop multiplexers, space switches, filters, etc. However, as optical systems have penetrated access networks and down into data centers competing demands for improved performance, increased integration, reduced footprint, reduced power consumption, increased flexibility, reconfigurability, and lower cost have become stronger such that today the drive within the photonic component community is to replace multiple discrete components and/or hybrid assembles with monolithically integrated circuits.

Silicon based integrated photonics offers a platform for many optical functions through microelectromechanical systems (MEMS) and microoptoelectromechanical systems (MOEMS), silicon waveguides, integrated CMOS electronics and hybrid integration of compound semiconductor elements for optical gain. However, within the prior art the majority of MEMS and MOEMS devices were designed for free space optical interconnections. Accordingly, it would be beneficial to provide optical component designers with MOEMS elements supporting the provisioning of tunable sources, tunable filters, tunable receivers etc. in the planar waveguide domain without free space optics.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to microoptoelectromechanical systems (MOEMS) and more particular to designs for optical microelectromechanical systems (MEMS) based wavelength tunable components such as sources, filters, and detectors exploiting such optical MEMS elements.

In accordance with an embodiment of the invention there is provided a photonic circuit comprising a substrate, a rotatable microelectromechanical systems (R-MEMS) element with a planar waveguide upon the upper surface and having a diffraction grating formed therein, and a channel waveguide supporting propagation of optical signals within a predetermined wavelength range coupled to the R-MEMS element; wherein rotation of the R-MEMS results in optical signals within a predetermined subset of the predetermined wavelength range being coupled back to the channel waveguide.

In accordance with an embodiment of the invention there is provided a photonic circuit comprising a substrate, a rotatable microelectromechanical systems (R-MEMS) element with a planar waveguide upon the upper surface and having a mirror formed therein and a channel waveguide supporting propagation of optical signals within a predetermined wavelength range coupled to the R-MEMS element. The photonic circuit further comprising a reflective diffraction grating, wherein rotation of the R-MEMS results in optical signals within a predetermined subset of the predetermined wavelength range being either coupled back to the channel waveguide after they have been reflected from the mirror, coupled to the reflective diffraction grating, and reflected again by the mirror or coupled to another channel waveguide after they have been reflected from the mirror, coupled to the reflective diffraction grating, and reflected by the reflective diffraction grating.

In accordance with an embodiment of the invention there is provided a photonic circuit comprising a substrate, a rotatable microelectromechanical systems (R-MEMS) element with a planar waveguide upon the upper surface and having a mirror formed therein, and a channel waveguide supporting propagation of optical signals within a predetermined wavelength range coupled to a reflective diffraction grating. The photonic circuit further comprising the reflective diffraction grating and a plurality of filter waveguides disposed between the reflective diffraction grating and the R-MEMS, wherein rotation of the R-MEMS results in optical signals coupled to the mirror from a filter waveguide of the plurality of filter waveguides being reflected back via the filter waveguide of the plurality of filter waveguides to the reflective diffraction grating and are coupled from the reflective diffraction grating to either the channel waveguide or to another channel waveguide.

In accordance with an embodiment of the invention there is provided a photonic circuit comprising a substrate, a rotatable microelectromechanical systems (R-MEMS) element with a planar waveguide upon the upper surface and having an elliptical mirror formed therein wherein the R-MEMS pivots around a first focal point of the elliptical mirror, and an optical waveguide having an end disposed at the first focal point of the elliptical mirror; wherein rotation of the R-MEMS element results in a second focal point of the elliptical mirror traversing a predetermined path.

In accordance with an embodiment of the invention there is provided a photonic circuit comprising a substrate, a rib waveguide suspended above the substrate and having a facet, a planar waveguide disposed opposite the facet of the rib waveguide with a predetermined gap between a facet of the planar waveguide and a facet of the rib waveguide and a concave diffraction grating formed within the planar waveguide for retro-reflecting optical signals coupled into the planar waveguide from the rib waveguide back to the rib waveguide. The photonic circuit further comprising a first microelectromechanical systems (MEMS) element coupled to the rib waveguide wherein the facet of the rib waveguide is moved relative to the planar waveguide by the action of the first MEMS element.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
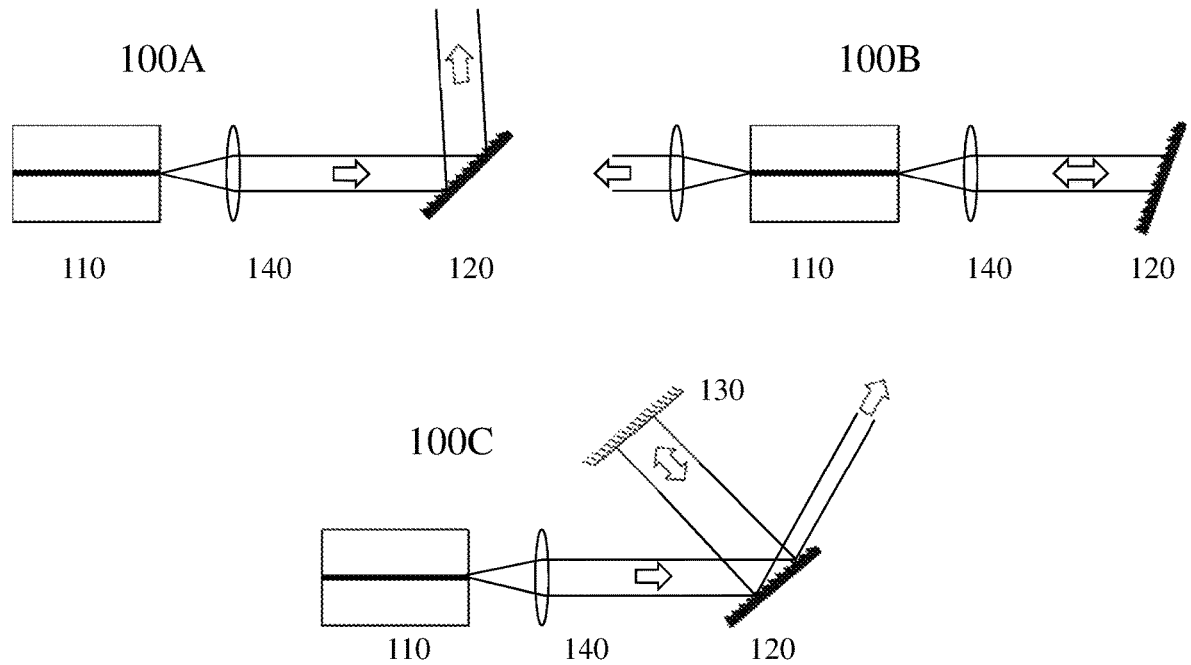
FIG. 1 depicts schematics of tunable optical sources exploiting diffraction gratings within transmissive Littrow, reflective Littrow, and transmissive Littman-Metcalf configurations as known in the prior art for bulk and micro-optic implementations.

The present invention is directed to microoptoelectromechanical systems (MOEMS) and more particular to designs for optical microelectromechanical systems (MEMS) based wavelength tunable components such as sources, filters, and detectors exploiting such optical MEMS elements.

The ensuing description provides representative embodiment(s) only, and is not intended to limit the scope, applicability or configuration of the disclosure. Rather, the ensuing description of the embodiment(s) will provide those skilled in the art with an enabling description for implementing an embodiment or embodiments of the invention. It being understood that various changes can be made in the function and arrangement of elements without departing from the spirit and scope as set forth in the appended claims. Accordingly, an embodiment is an example or implementation of the inventions and not the sole implementation. Various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention can also be implemented in a single embodiment or any combination of embodiments. It would also be evident that an embodiment may refer to a method or methods of manufacturing a device rather than the actual design of a device and that vice-versa an embodiment of the invention may refer to a device or devices rather than the method or methods of manufacturing.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the inventions. The phraseology and terminology employed herein is not to be construed as limiting but is for descriptive purpose only. It is to be understood that where the claims or specification refer to "a" or "an" element, such reference is not to be construed as there being only one of that element. It is to be understood that where the specification states that a component feature, structure, method, or characteristic "may", "might", "can" or "could" be included, that particular component, feature, structure, or characteristic is not required to be included. It would also be evident that an embodiment and/or the phraseology and/or terminology may refer to a method or methods of manufacturing a device rather than the actual design of a device and that vice-versa an embodiment and/or the phraseology and/or terminology may refer to a device or devices rather than the method or methods of manufacturing.

Reference to terms such as "left", "right", "top", "bottom", "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users.

Reference to terms "including", "comprising", "consisting" and grammatical variants thereof do not preclude the addition of one or more components, features, steps, integers or groups thereof and that the terms are not to be construed as specifying components, features, steps or integers. Likewise, the phrase "consisting essentially of", and grammatical variants thereof, when used herein is not to be construed as excluding additional components, steps, features integers or groups thereof but rather that the additional features, integers, steps, methods, components or groups thereof do not materially alter the basic and novel characteristics of the claimed composition, device or method. If the specification or claims refer to "an additional" element, that does not preclude there being more than one of the additional element or method.

An "optical waveguide" as used herein, and throughout this disclosure, refers to a structure that confines electromagnetic radiation within a predetermined wavelength range. This includes, but is not limited, to the visible wavelength range (typically defined as 400 nm≤λ≤700 nm) and near infra-red (IR) (700 nm≤λ≤1650 nm) including telecommunication bands such as O-band (1260 nm≤λ≤1360 nm), S-band (1460 nm≤λ≤1530 nm), C-band (1530 nm≤λ≤1565 nm), and L-band (1565 nm≤λ≤1625 nm). However, optical waveguides may also support waveguiding of optical signals within the near ultra-violet (UV), far UV, mid-IR, and far IR according to the waveguide materials, waveguide design etc.

A "channel" waveguide as used herein, and throughout this disclosure, refers to a three-dimensional (3D) waveguide that confines the optical radiation (optical signal) laterally, vertically and directs the propagation within the waveguide.

A "slab" or "planar" waveguide as used herein, and throughout this disclosure, refers to a two-dimensional (2D) waveguide that confines the optical radiation (optical signal) vertically but not within the lateral or forward propagating directions.

A "passive" waveguide as used herein, and throughout this disclosure, refers to section of an optical waveguide or an optical waveguide having material characteristics that vary according to the intrinsic properties of the material from which the passive waveguide is formed.

An "active" waveguide as used herein, and throughout this disclosure, refers to a section of an optical waveguide or an optical waveguide supporting modification of an optical characteristic through the application of an electrical current or voltage in addition to intrinsic variations such as refractive index with temperature. Electrical current or voltage being applied via semiconductor junctions, p-n junctions, p-i-n junctions, quantum structures, and quantum dots for example. Such structures can comprise single or multiple quantum structures and junctions to generate single or multiple wavelengths and combinations thereof.

A "compound semiconductor" or "semiconductor" as used herein, and throughout this disclosure, refers to a material having an electrical conductivity value falling between that of a conductor and an insulator wherein the material may be an elemental materials or a compound material. A semiconductor may include, but not be limited to, an element, a binary alloy, a tertiary alloy, and a quaternary alloy. Structures form from a semiconductor or semiconductors may comprise a single semiconductor material, two or more semiconductor materials, a semiconductor alloy of a single composition, a semiconductor alloy of two or more discrete compositions, and a semiconductor alloy graded from a first semiconductor alloy to a second semiconductor alloy. A semiconductor may be undoped (intrinsic), p-type doped, n-typed doped, graded in doping from a first doping level of one type to second doping level of the same type, or grading in doping from a first doping level of one type to a second doping level of a different type. Semiconductors may include, but are not limited to:

- Elements, such as certain group IV and group VI elements, e.g. silicon (Si) and germanium (Ge), and binary group IV alloys, e.g. silicon germanium (SiGe) and silicon carbide (SiC);
- III-V semiconductors, such as those between aluminum (Al), gallium (Ga), and indium (In) with nitrogen (N), phosphorous (P), arsenic (As) and tin (Sb), including for example GaN, GaP, GaAs, InP, InAs, AN and AlAs; and
- Organic semiconductors, which may include single molecules oligomers, organic polymers, and polycyclic aromatic hydrocarbons.

A "semiconductor optical emitter" (SOE) as used herein, and throughout this disclosure, refers to an electrically pumped semiconductor device in which the active optically emitting medium is formed by a p-n junction of a semiconductor diode. If the semiconductor optical emitter is formed within a cavity having low optical reflectivity the SOE will providing optical gain (amplification) providing a "semiconductor optical amplifier" (SOA). If formed within a cavity having high reflectivity, then the SOE will provide optical gain for spontaneous emission from the SOE within the wavelength range defined by the characteristics of the SOE and the high reflectivity facets thereby forming a laser diode.

An "external cavity diode laser" (commonly referred to as an ECL) employs a SOA with one high reflectivity facet and a second high reflectivity facet formed from a tunable wavelength component such as a diffraction grating, for example. Examples of ECL devices are depicted in first to third schematics 100A to 100C respectively in FIG. 1 which depict transmissive Littrow, reflective Littrow, and transmissive Littman-Metcalf configuration. In each the SOE 110 is coupled to a diffraction grating 120 which is either tuned directly, e.g. transmissive and reflective Littrow configurations 100A and 100B, or indirectly, e.g. via rotating mirror 130. Within the prior art ECLs have primarily exploited free-space optical assemblies as depicted by the lenses 140 which couple the SOE to a collimated beam which is routed to the diffraction grating 120. Some fiber based ECLs within the prior art exploit tunable distributed Bragg reflectors. Hybrid integrated ECLs exploiting waveguide based distributed Bragg gratings have included Jeong et al. in "Over 26 nm Wavelength Tunable External Cavity Laser based on Polymer Waveguide Platforms for WDM Networks" (IEEE Phot. Tech. Lett., Vol. 18(2), pp 2102-2104) which exploits thermo-optic control of a polymer waveguide Bragg to provide wavelength tuning and Menard et al. in World Patent Publication WO/2015/131270 entitled "Methods and System for Wavelength Tunable Optical Components and Sub-Systems" exploit a MEMS mirror to address a waveguide Bragg grating within an array of waveguide Bragg gratings.

Whilst the former polymer waveguides provide a low complexity optical waveguide solution their tuning is slow, due to thermo-optic effect, and their wavelength alignment to any system requires an additional wavelength locker. In contrast the MEMS mirror solution offers faster switching to a new wavelength and the substantially reduced thermo-optic effect in the silicon dioxide ($SiO_2$) or silicon nitride ($Si_3N_4$) on silicon waveguides. However, the inventors have established a range of other MOEMS based designs that provide tunable wavelength characteristics such as within a tunable ECL. These designs in different embodiments support wavelength scanning, such as applicable in optical spectrometry, as well as programmable discrete wavelengths such as applicable to spectrometry and optical networks. Whilst the embodiments of the invention below are described below with respect to an ECL optical source it would be evident to one of skill in the art that the MOEMS plus optical waveguide geometries presented in respect of FIGS. 2 to 20 may also be employed in wavelength tunable receivers, reconfigurable optical add—drop multiplexers (ROADMs), wavelength selective optical switches, and other wavelength selective structures, for example either directly or in combination with other optical elements such as circulators, directional couplers, etc.

Figure 2:
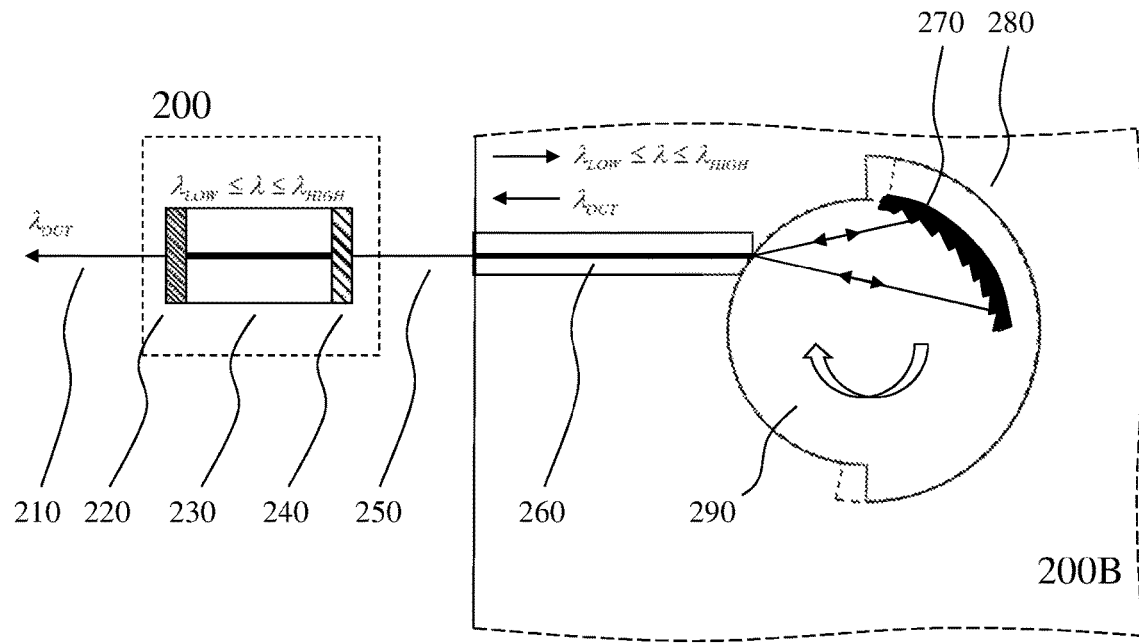
FIG. 2 depicts a MOEMS tunable source exploiting a rotatable MEMS (R-MEMS) element with integrated concave diffraction grating (CDG) within in a Littrow configuration according to an embodiment of the invention.

Now referring to FIG. 2 there is depicted a MOEMS tunable source exploiting a rotatable MEMS (R-MEMS) element with integrated concave diffraction grating (CDG) within in a Littrow configuration according to an embodiment of the invention. As depicted a photonic integrated circuit (PIC) 200B is coupled to a SOE 200 via an optical fiber 250. The SOE 200 comprises a SOA 230 with a high reflectivity interface 220, e.g. a metallic coating, on one facet and a low reflectivity interface 240, e.g. a dielectric coating, on the other facet. The low reflectivity interface 240 being coupled to the optical fiber and the high reflectivity interface 220 to an output optical fiber 210. The PIC 200B comprises a channel (3D) waveguide 260 which couples to a grating 270 formed within an R-MEMS 280 which has formed upon its surface a slab (planar or 2D) waveguide 290.

As depicted in FIG. 2 within the PIC 200B the optical emission from the SOE 200 propagates in the channel waveguide 260 and then enters the rotating platform formed by the R-MEMS 280 which contains within a concave diffraction grating (CDG) 270. Within the planar waveguide 290 the optical signals expand laterally before being retro-reflected by the CDG 270 which is configured in the Littrow configuration, and the reflected signals goes back the same optical path in that they are beam focused back into channel waveguide 260 and therein to the optical fiber 250 and SOE 200. However, as the CDG 270 generates focal points along a locus where the spot position along the locus is determined by wavelength it would be evident that the optical wavelength coupled back to the channel waveguide 260 depends upon the rotation angle of the R-MEMS 280. Accordingly, these optical wavelengths support lasing within the ECL and define the output wavelength on the output fiber 210. The linewidth of the ECL is dependent upon the characteristics of the CDG 270 and the channel waveguide 260. This locus is a Rowland circle and accordingly, the edge of the R-MEMS 280 adjacent the channel waveguide 260 is that Rowland circle such that the optical focus is at the end of the channel waveguide.

Figure 3:
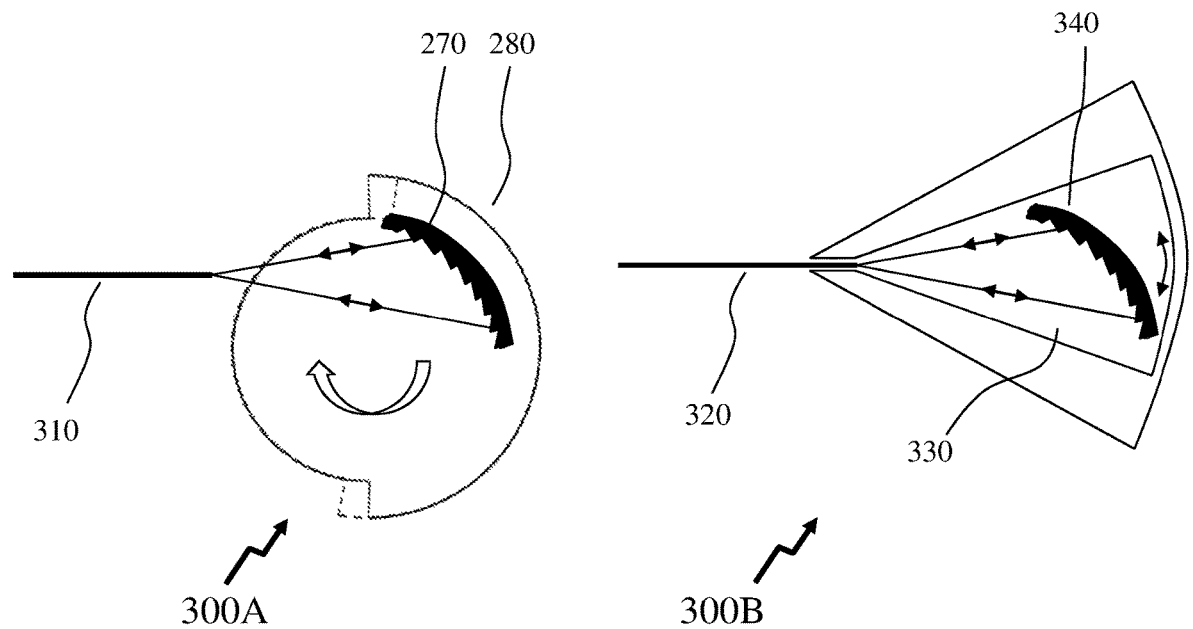
FIG. 3 depicts variants of the CDG within an R-MEMS element in a Littrow configuration depicted in FIG. 2 according to embodiments of the invention.

Now referring to FIG. 3 there are depicted variants of the CDG within the R-MEMS element in a Littrow configuration depicted in FIG. 2 according to embodiments of the invention. In first image 300A the channel waveguide 310 terminates prior to the R-MEMS 280 with the CDG 270 formed within. Accordingly, the optical beam propagates within a region of planar waveguide prior to the R-MEMS 280 such that the R-MEMS rotation is now within an expanded beam with the planar waveguide rather than the R-MEMS 280—channel waveguide 260 interface depicted in FIG. 2, this being the focal point. In this instance the rotation of the CDG 270 is about the centre of the Rowland circle. In second image 300B the R-MEMS 330 and the CDG 340 are rotating around the point of connection between the channel waveguide 320 and the planar waveguide upon the R-MEMS 330.

Figure 4:
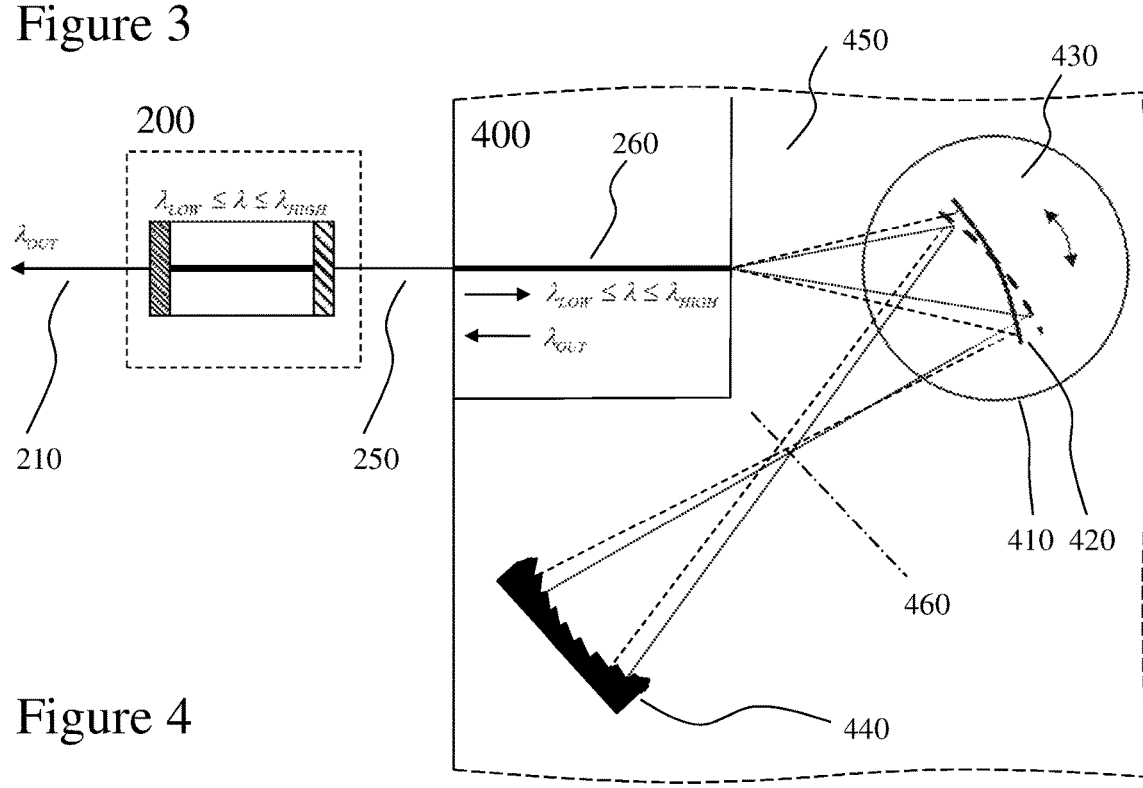
FIG. 4 depicts a tunable optical source (TOS) exploiting an R-MEMS element with integrated CDG and planar waveguides according to an embodiment of the invention.

Referring to FIG. 4 there is depicted a tunable optical source (TOS) exploiting an R-MEMS with integrated CDG and planar waveguides according to an embodiment of the invention. As depicted a PIC 400 is coupled to a SOE 200 via an optical fiber 250. The PIC 400 comprises a channel (3D) waveguide 260 which couples to a planar waveguide 450 within which are formed an R-MEMS 410, which has formed upon its surface a mirror 420 and a planar waveguide 430, and a CDG 440. Accordingly, within the PIC 400 the optical signals propagate and expand in the planar waveguide 450, are coupled to the planar waveguide 430 within the R-MEMS 410, are reflected by the mirror 420 and focused onto a focal line 460, re-expand and are retro-reflected by the CDG 440 which is used in the Littrow configuration with adapted focalization, and then follows the reverse path with associated beam focusing and defocusing to the mirror 420, channel waveguide 260 and therein to the SOE 200. Accordingly, the mode of operation is that light is generated in the gain medium of the SOE 200 is filtered wherein the wavelength is defined by the CDG 440 and the mirror 420 in the R-MEMS 410. Accordingly, continuous tuning is possible. The beam between the rotating mirror 420 and the CDG 440 may not focus on a focal line but instead the focalization of the CDG 440 and/or the rotating mirror 420 is adapted to focus back the light into the channel waveguide 260.

Figure 5:
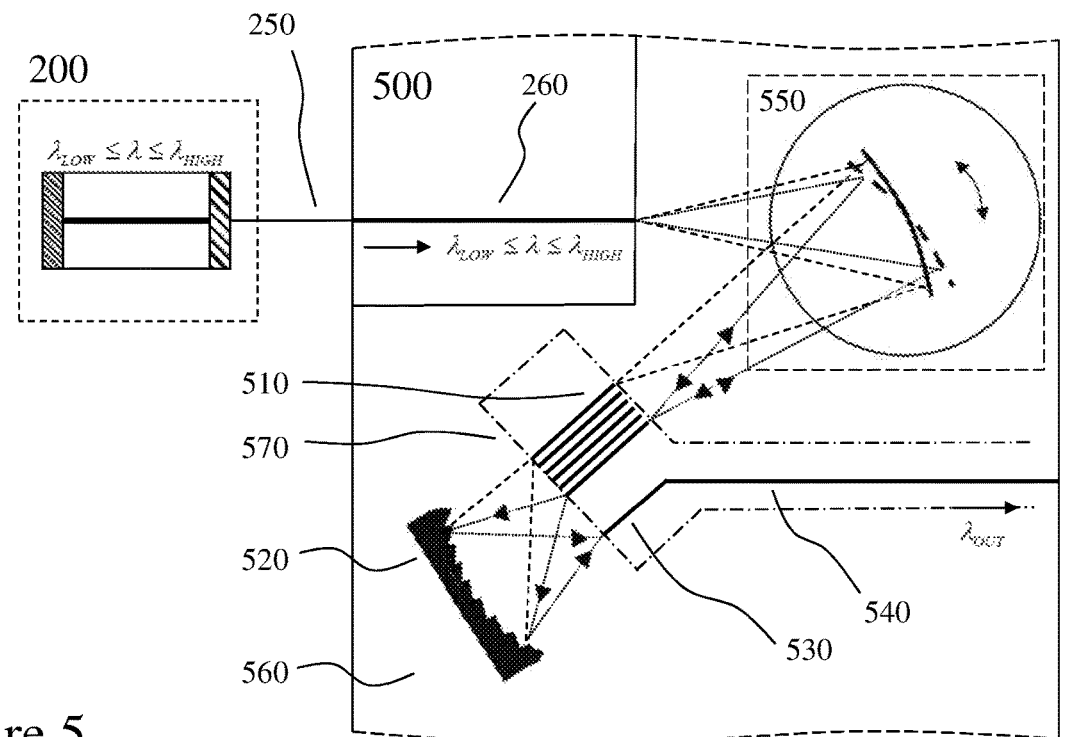
FIG. 5 depicts a TOS exploiting an R-MEMS mirror with a CDG and planar waveguides according to an embodiment of the invention.

FIG. 5 depicts a TOS exploiting an R-MEMS mirror with a CDG and planar waveguides according to embodiment of the invention. As depicted a PIC 500 is coupled to a SOE 200 via an optical fiber 250 but without output optical fiber 210. The PIC 500 comprises a channel (3D) waveguide 260 which couples to a planar waveguide 560 within which are formed an R-MEMS 550, which has formed upon its surface a mirror and a planar waveguide, and a CDG 520. Also disposed within the PIC 500 is a region of channel waveguides 570. Accordingly, within the PIC 500 the optical signals propagate and expand in the planar waveguide 560, are coupled to the planar waveguide within the R-MEMS 550, are reflected by the mirror and focused onto a focal line. However, now unlike FIG. 4 and simply re-expanding with the planar waveguide 560 the optical signal couples to one of a plurality of filter waveguides 510, each being a short waveguide region, and then re-launches into the planar waveguide 560 and are reflected by the CDG 520. However, now rather than retro-reflecting in a Littrow configuration as depicted in FIG. 4 the reflected optical signal is coupled to an output at the end of the PIC 500 via first and second output waveguide sections 530 and 540 respectively. Accordingly, the mode of operation is that light is generated in the gain medium of the SOE 200 is filtered wherein the wavelength is defined by the CDG 520 and the launch signal coupled to it from the selected filter waveguide of the plurality of filter waveguides 510 and the mirror within the R-MEMS 550 and the first waveguide section 530. Accordingly, PIC 500 provides discrete wavelength tuning defined by the CDG 520, the plurality of filter waveguides 510, and the first waveguide section 530 which launch the broad emission of the SOE 200 to the CDG 520 which spreads the spectrum which is then sampled by the first output waveguide section 530. Accordingly, the beam from the SOE 200 is spread and focused twice, once by the mirror within the R-MEMS 550 and then by the CDG 520.

Figure 6:
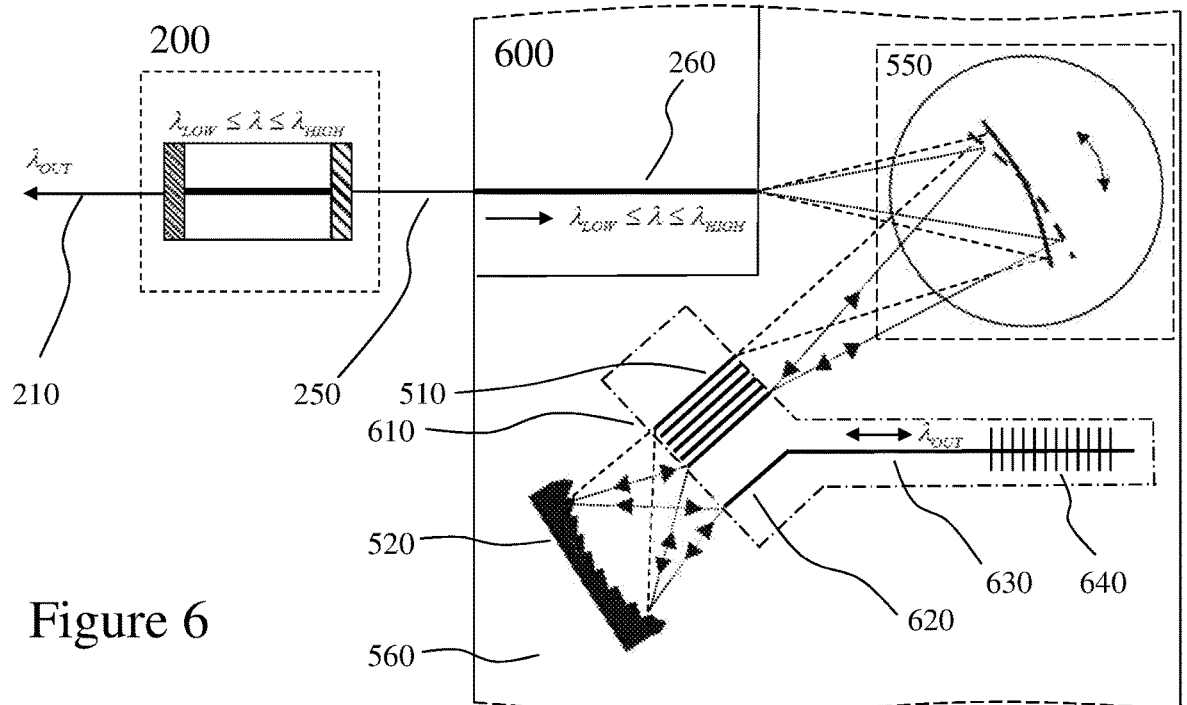
FIG. 6 depicts a TOS exploiting an R-MEMS mirror with a CDG, broadband Bragg reflector and planar waveguides according to an embodiment of the invention.

Referring to FIG. 6 there is depicted a TOS exploiting an R-MEMS mirror with a CDG, broadband Bragg reflector and planar waveguides according to an embodiment of the invention. As depicted a PIC 600 is coupled to a SOE 200 via an optical fiber 250 but now with output optical fiber 210. The PIC 600 comprises in common with PIC 500 in FIG. 5 a channel (3D) waveguide 260 which couples to a planar waveguide 560 within which are formed an R-MEMS 550, which has formed upon its surface a mirror and a planar waveguide, and a CDG 520. Also disposed within the PIC 600 is a region of channel waveguides 610. Accordingly, within the PIC 600 the optical signals propagate and expand in the planar waveguide 560, are coupled to the planar waveguide within the R-MEMS 550, are reflected by the mirror and focused onto a focal line. In common with PIC 500 in FIG. 5 the optical signal couples to one of a plurality of filter waveguides 510, each being a short waveguide region, and then re-launches into the planar waveguide 560 and are reflected by the CDG 520. However, now rather than retro-reflecting in a Littrow configuration as depicted in FIG. 4 the reflected optical signal is coupled to a first waveguide section 620 and therein second waveguide section 630 within which is formed broadband Bragg grating 640.

Accordingly, the mode of operation is that light is generated in the gain medium of the SOE 200 is filtered wherein the wavelength is defined by the CDG 520 and the launch signal coupled to it from the selected filter waveguide of the plurality of filter waveguides 510 and the mirror within the R-MEMS 550 together with the filtering of the first waveguide section 620, The filtered wavelength signal is retro-reflected from the broadband Bragg grating 640, filter waveguide 510, R-MEMS 550 to the channel waveguide 260 and the SOE 200 which now lases at the filtered wavelength. Accordingly, PIC 600 provides discrete wavelength tuning defined by the CDG 520 and plurality of filter waveguides 510 which launch the broad emission of the SOE 200 to the CDG 520 which spreads the spectrum which is then sampled by the first output waveguide section 620 before being retro-reflected. Accordingly, the beam from the SOE 200 is spread and focused four times, twice by the mirror within the R-MEMS 550 and then twice by the CDG 520.

Optionally, the embodiments of the invention depicted in respect of FIGS. 5 and 6 may be combined in that a broadband Bragg grating may be inserted into the second waveguide section 540 of PIC 500 in FIG. 5 such that the Bragg grating filters out of band signals.

Figure 7:
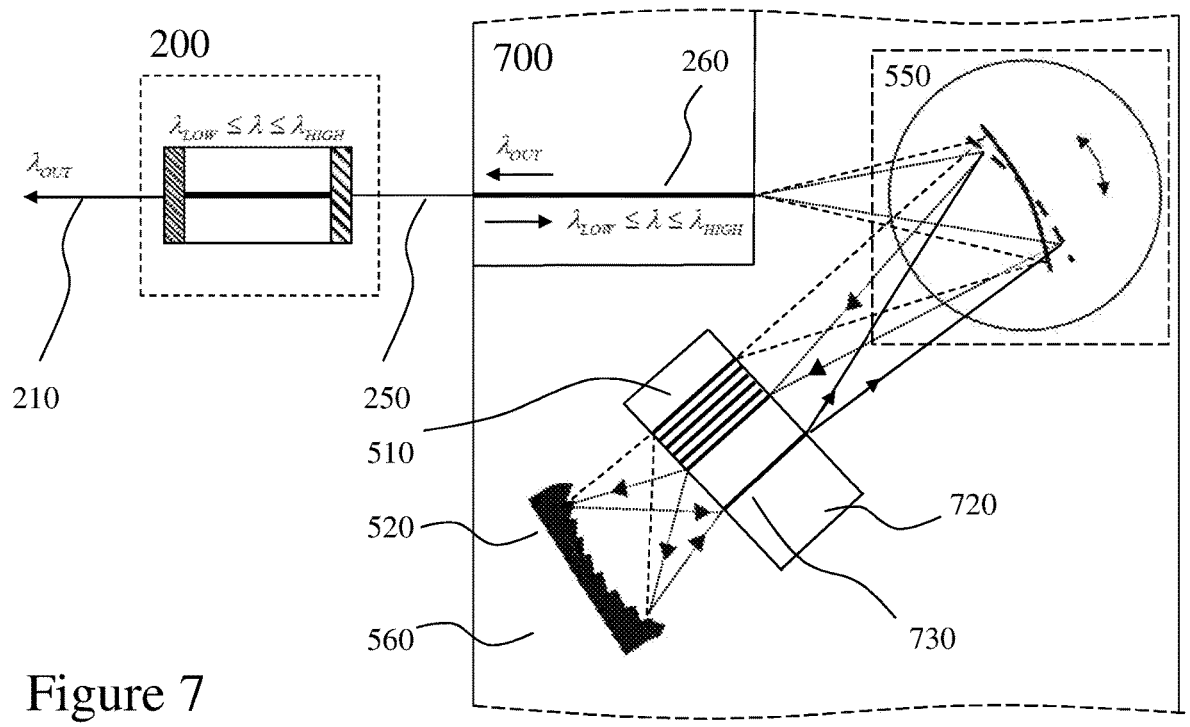
FIG. 7 depicts a TOS exploiting an R-MEMS mirror with a CDG, channel waveguides and planar waveguides according to an embodiment of the invention.

FIG. 7 depicts a TOS exploiting an R-MEMS mirror with a CDG, channel waveguides and planar waveguides according to an embodiment of the invention. As depicted a PIC 700 is coupled to a SOE 200 via an optical fiber 250 and therein to output optical fiber 210. The PIC 700 comprises a channel (3D) waveguide 260 which couples to a planar waveguide 560 within which are formed an R-MEMS 550, which has formed upon its surface a mirror and a planar waveguide, and a CDG 520. Also disposed within the PIC 500 is a region of channel waveguides 510. Accordingly, within the PIC 700 the optical signals propagate and expand in the planar waveguide 560, are coupled to the planar waveguide within the R-MEMS 550, are reflected by the mirror and focused onto a focal line. In common with PICs 500 and 600 in FIGS. 5 and 6 the optical signal couples to one of a plurality of filter waveguides 510, each being a short waveguide region, and then re-launches into the planar waveguide 560 and are reflected by the CDG 520. However, now rather than retro-reflecting in a Littrow configuration as depicted in FIG. 4, coupling to an output in FIG. 5, or retro-reflecting from a broadband Bragg reflector in FIG. 6, the reflected optical signal is coupled to a stub waveguide 730 within the channel waveguide region 730 of the PIC 700 and therein re-coupled to the channel waveguide 260 from the mirror within the R-MEMS 550. Accordingly, the mode of operation is that light is generated in the gain medium of the SOE 200 is filtered wherein the wavelength is defined by the CDG 520 and the launch signal coupled to it from the selected filter waveguide of the plurality of filter waveguides 510 and the mirror within the R-MEMS 550 together with the filtering of the stub waveguide 730. Accordingly, PIC 700 provides discrete wavelength tuning defined by the CDG 520 and plurality of filter waveguides 510 which launch the broad emission of the SOE 200 to the CDG 520 which spreads the spectrum which is then sampled by the stub waveguide 730. Accordingly, the beam from the SOE 200 is spread and focused four times, twice by the mirror within the R-MEMS 550 and then twice by the CDG 520.

Figure 8:
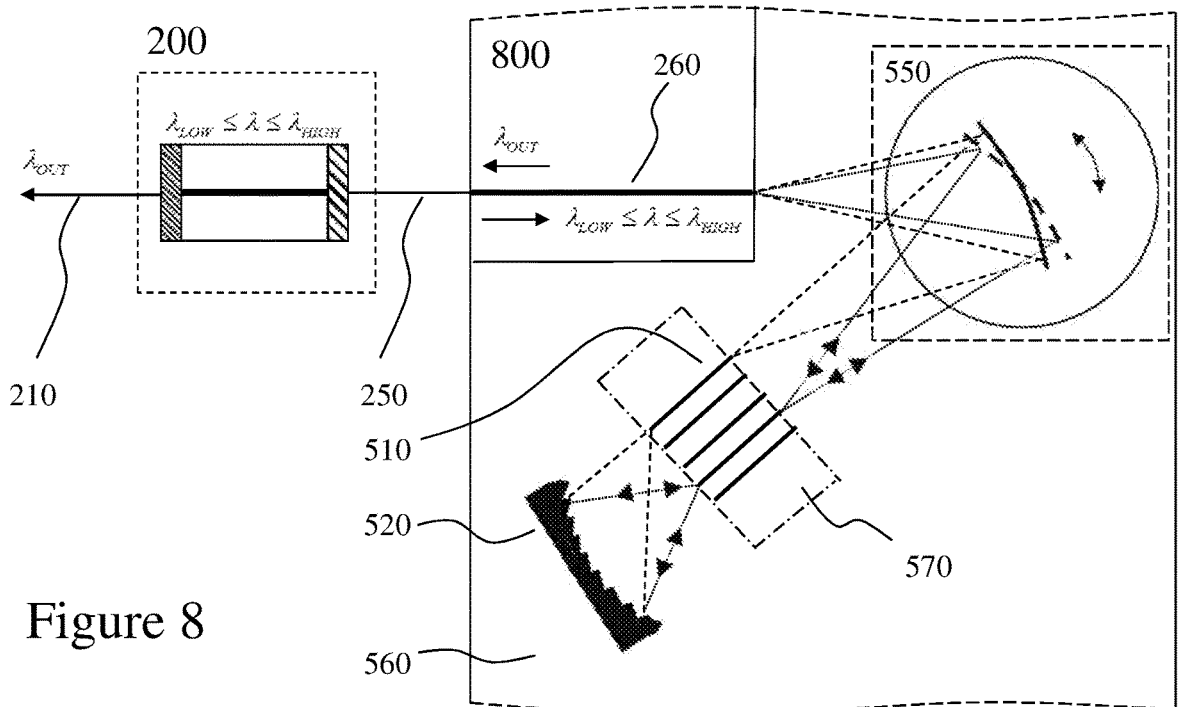
FIG. 8 depicts a TOS exploiting an R-MEMS mirror with a CDG, channel waveguides and planar waveguides in a Littrow configuration according to an embodiment of the invention.

Now referring to FIG. 8 there is depicted a TOS exploiting an R-MEMS mirror with a CDG, channel waveguides and planar waveguides in a Littrow configuration according to an embodiment of the invention. As depicted a PIC 800 is coupled to a SOE 200 via an optical fiber 250. The PIC 800 comprises a channel waveguide 260 which couples to a planar waveguide 560 within which are formed an R-MEMS 550, which has formed upon its surface a mirror and a planar waveguide, and a CDG 520. Accordingly, within the PIC 800 the optical signals propagate and expand in the planar waveguide 560, are coupled to the planar waveguide within the R-MEMS 550, are reflected by the mirror and focused onto a focal line. Then in common with FIGS. 5 to 7 the optical signal couples to one of a plurality of filter waveguides 510, each being a short waveguide region with a first end on the focal line, and then re-launches into the planar waveguide 560 and are reflected by the CDG 520. However, in contrast to the previous embodiments in FIGS. 4 to 7 respectively the reflected optical signals from the CDG 520 are re-coupled to a subset of the plurality of filter waveguides 510 and therein back to the mirror within the R-MEMS 550 to the channel waveguide 260. Accordingly, the wavelength is defined by the CDG 520 and the mirror within the R-MEMS 550.

Figure 9:
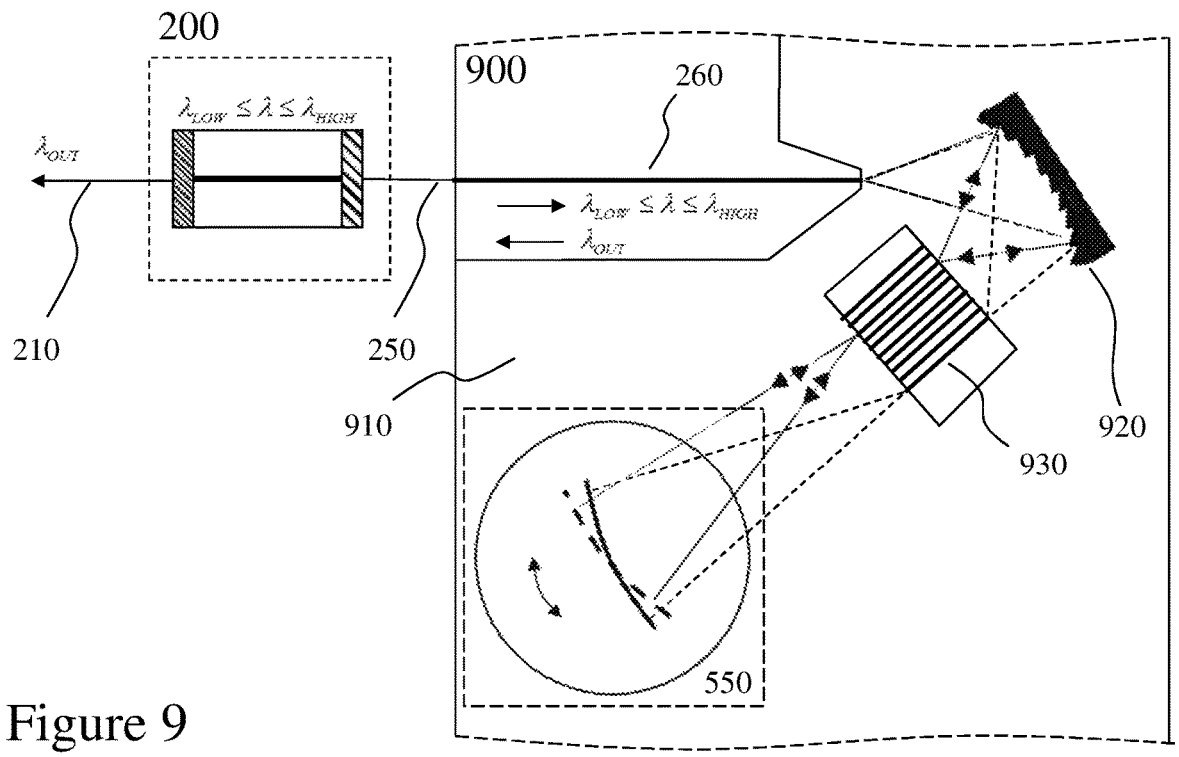
FIG. 9 depicts a TOS exploiting an R-MEMS mirror with a CDG, channel waveguides and planar waveguides according to an embodiment of the invention.

Referring to FIG. 9 depicts a TOS exploiting an R-MEMS mirror with a CDG, channel waveguides and planar waveguides according to an embodiment of the invention. Accordingly, as depicted a PIC 900 is coupled to a SOE 200 via an optical fiber 250. The PIC 900 comprises a channel waveguide 260 which couples to a planar waveguide 910 within which are formed a CDG 920 which couples to a filter waveguide 930 within a first subset of a plurality of filter waveguides 930 having first ends on the focal line of the CDG 920. The distal ends of the first subset of the plurality of filter waveguides 930 couple to a mirror which reflects a selected filter waveguide 930 back to a waveguide within a second subset of the plurality of filter waveguides 930. The waveguide then couples back to the CDG 920 and therein the channel waveguide 260.

In this manner the optical path from the SOE 200 is to the optical fiber 250 and channel waveguide 260 wherein it then propagates in the planar waveguide 910, expanding as it does, before being retro-diffracted by the CDG 920, propagates in the planar waveguide 910, focuses into the first subset of the plurality of filter waveguides 930, e.g. rib waveguides, propagates within these and then re-expands in the planar waveguide 910 whereupon they are reflected by the mirror within the R-MEMS 550. The signal re-focusses onto a waveguide within the second subset of the plurality of filter waveguides 930 wherein it is re-coupled to the CDG 920, the channel waveguide 260 and therein to the SOE 200. Accordingly, the optical feedback loop exists via the high reflectivity facet of the SOE 200 and the rotating mirror within the R-MEMS 550 with wavelength dispersion provided via the CDG 920. The mirror within the R-MEMS 550 may, for example, be of circular curvature with the center of rotation at the convergence point of the first subset of the plurality of filter waveguides 930. If the CDG 920 is used in a single order then the rotating mirror within the R-MEMS 550 would reflect the light back to its originating point, i.e. the first and second subsets of the plurality of filter waveguides 930 are the same subset, or the central ray impinging on the circular mirror would be a symmetry axis of the circle on which the mirror is based. The center of rotation may be on the mirror itself. If, however, two orders of the CDG 920 are employed then the first subset of the plurality of filter waveguides 930 would be coupled to in one order whilst the second subset of the plurality of filter waveguides 930 would couple to the other order.

It would be evident to one skilled in the art that removal of the plurality of filter waveguides 930 would provide for a continuously tunable optical source provided that the focalization was adjusted in a similar manner as that described and depicted in respect of FIG. 4.

Figure 10:
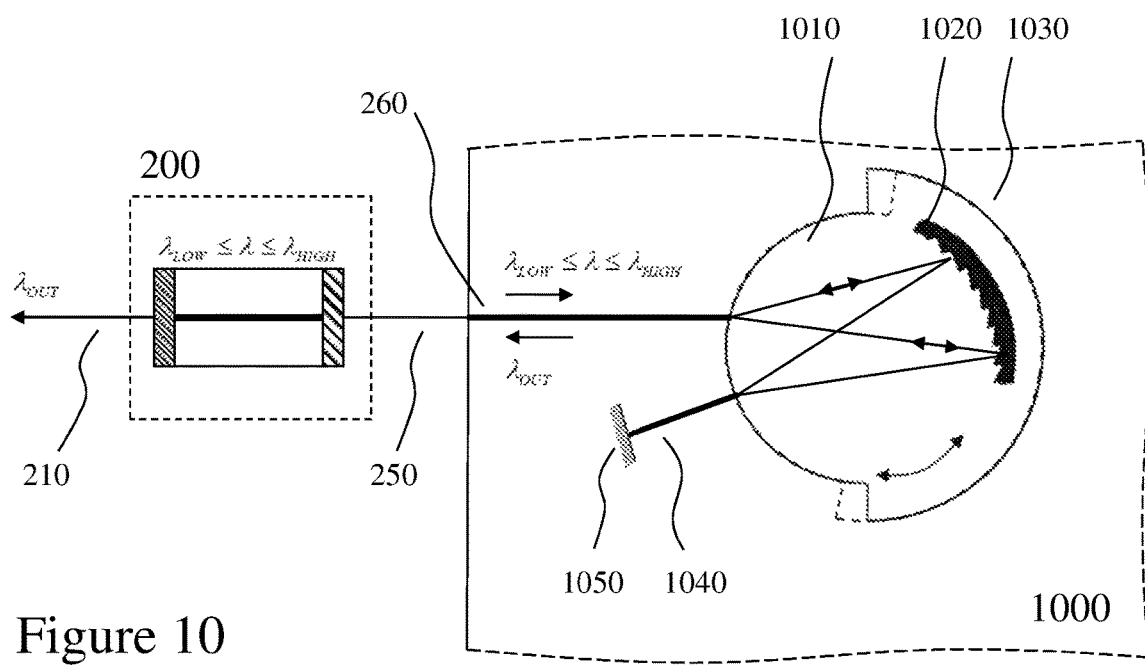
FIG. 10 depicts a TOS exploiting an R-MEMS with a CDG and distributed Bragg reflector waveguides according to an embodiment of the invention.

FIG. 10 depicts a TOS exploiting an R-MEMS with a CDG and distributed Bragg reflector waveguides according to an embodiment of the invention. Accordingly, as depicted a PIC 1000 is coupled to a SOE 200 via an optical fiber 250. The PIC 1000 comprises a channel waveguide 260 which couples to a planar waveguide 1010 formed upon an R-MEMS 1030 and therein expands until it impinges a CDG 1020 formed upon the R-MEMS 1030 and once retro-diffracted by the CDG 1020, focuses into the stub waveguide 1040 and therein mirror 1050 wherein it reflects back and re-traces the optical path. In this manner the output of the SOE 200 is filtered by the CDG 1020 in combination with the stub waveguide 1040 and mirror 1050 which sample the spectrum generated by the CDG 1020. Accordingly, rotation of the R-MEMS 1030 changes the output wavelength by defining the wavelength(s) reflected from the mirror 1050 at the end of the stub waveguide 1040.

Accordingly, the R-MEMS 1030 and CDG 1020 rotate along the Rowland circle. It would also be evident that the PIC 1000 also provides the option of continuous tuning. Optionally, the mirror 1050 may be a broadband Bragg reflector. Optionally, the mirror 1050 may be removed and the stub waveguide 1040 coupled to the edge of the PIC 1000 or to other optical elements within the PIC 1000.

Figure 11:
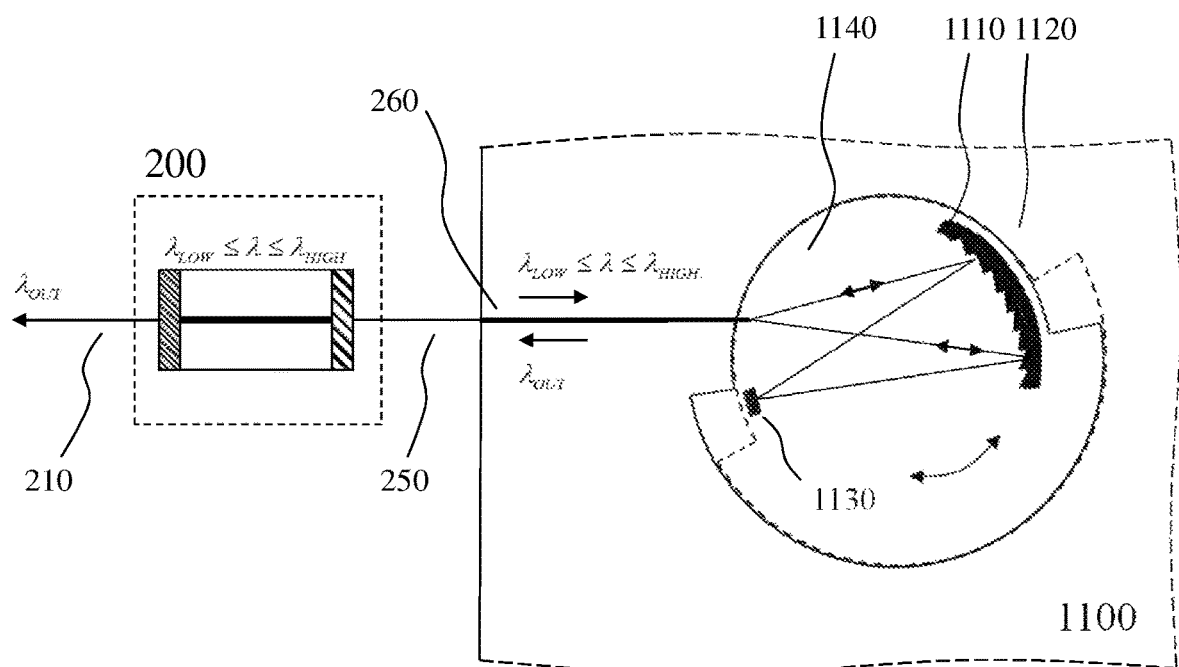
FIG. 11 depicts a TOS exploiting an R-MEMS with an integrated CDG according to an embodiment of the invention.

Now referring to FIG. 11 there is depicted a TOS exploiting an R-MEMS with an integrated CDG according to an embodiment of the invention. Accordingly, as depicted a PIC 1100 is coupled to a SOE 200 via an optical fiber 250. Within this embodiment of the invention the channel waveguide 260 coupled to the optical fiber 250 again couples to a planar waveguide 1140 upon an R-MEMS 1120 and therein couples to the CDG 1110 within the R-MEMS 1120. The retro-diffracted and focused optical signals are sampled by a mirror 1130 upon the R-MEMS 1120 wherein the signal from the mirror 1130 re-traces the optical path to the SOE 200 to provide the wavelength specific optical feedback. As with FIG. 10 the R-MEMS 1120 rotates such that the CDG 1110 rotates on the Rowland circle. As before continuous tuning is possible. The optical linewidth of the resulting ECL employing SOE 200 and PIC 1100 is determined by the focal length of the CDG 1110 and the size of the mirror 1130.

Figure 12:
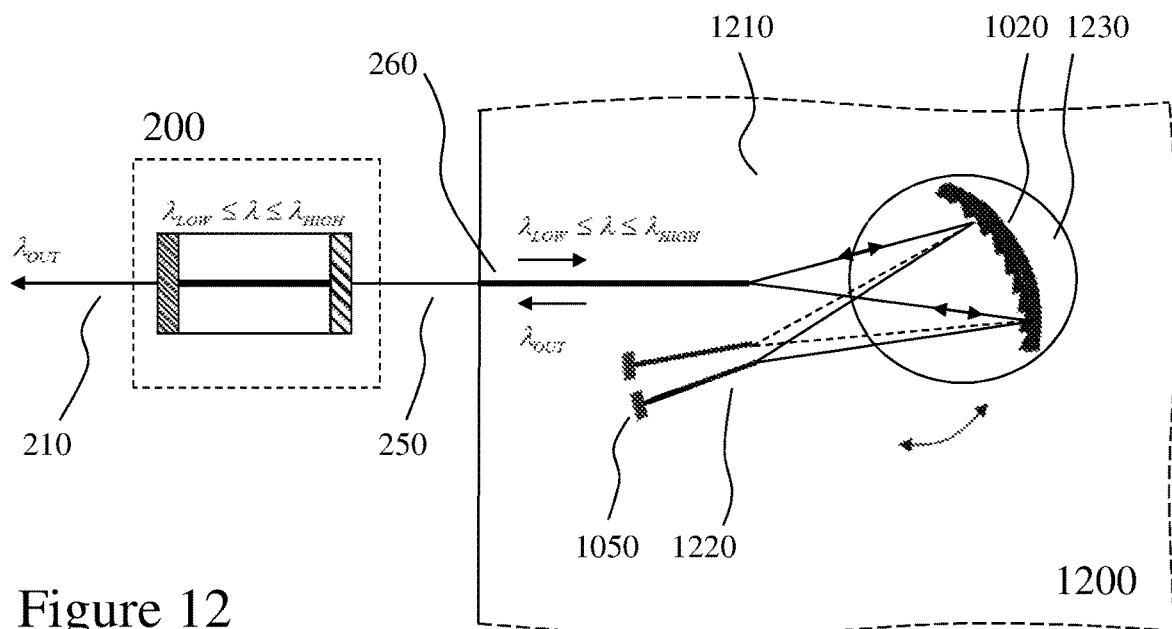
FIG. 12 depicts a TOS exploiting an R-MEMS with an integrated CDG and distributed Bragg reflector waveguides according to an embodiment of the invention.

Referring to FIG. 12 there is depicted a TOS exploiting an R-MEMS with an integrated CDG and distributed Bragg reflector waveguides according to an embodiment of the invention. Accordingly, as depicted a PIC 1200 is coupled to a SOE 200 via an optical fiber 250 wherein the overall configuration of PIC 1200 is very similar to that depicted with PIC 1000 in FIG. 10 except that the channel waveguide 260 couples to a planar waveguide 1210 before coupling to the planar waveguide and CDG 1020 on the R-MEMS 1230 and the stub waveguide 1220 similarly couples to the planar waveguide 1210. The R-MEMS 1230 and CDG 1020 are rotating around the pole of the CDG 1020 whilst the focal point of the CDG 1020 into the rib waveguides, channel waveguide 260 and stub waveguide 1220, may be outside or inside the Rowland circle.

Figure 13:
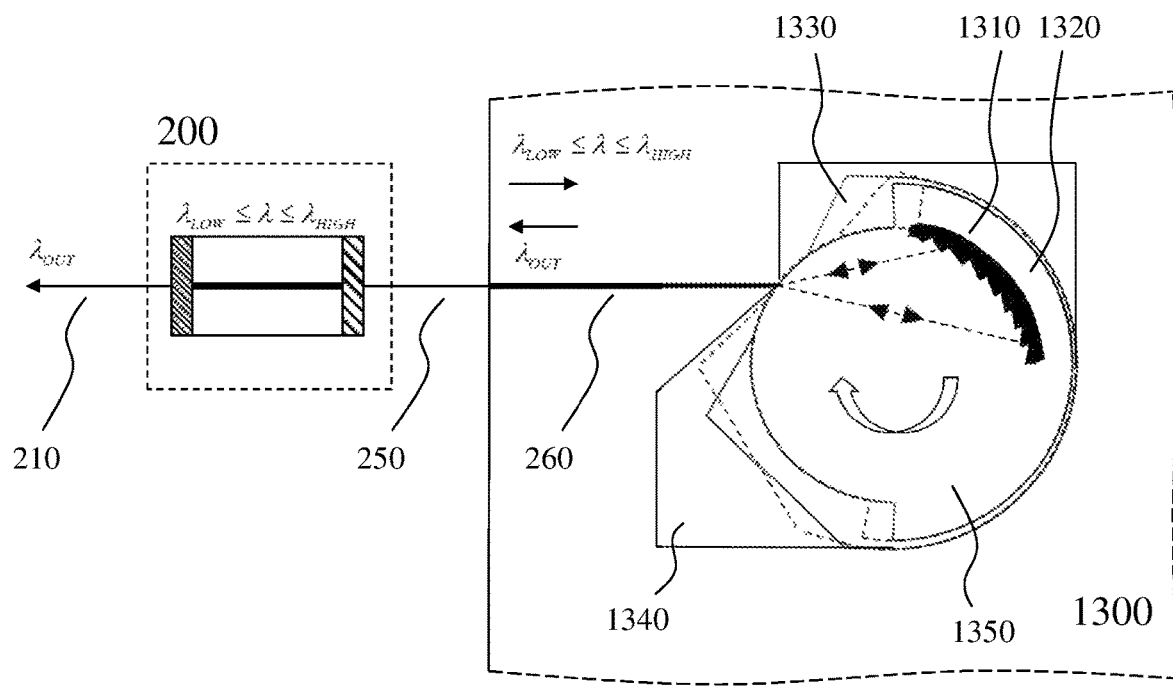
FIG. 13 depicts a TOS exploiting a double rotating MEMS with an integrated CDG in a Littrow configuration according to an embodiment of the invention.

Now referring to FIG. 13 depicts a TOS exploiting a double rotating MEMS with an integrated CDG in a Littrow configuration according to an embodiment of the invention. Accordingly, as depicted a PIC 1300 is coupled to a SOE 200 via an optical fiber 250 wherein the optical signals initially couple to a channel waveguide 260 which terminates at the gap between the PIC 1300 and the R-MEMS 1320 formed within the PIC 1300. The optical signals propagating within the planar waveguide 1350 within the R-MEMS 1320 impinge upon the CDG 1310 and then is retro-diffracted where the CDG 1310 is employed in a Littrow configuration, and the retro-diffracted optical signal is coupled back to the channel waveguide 260 and therein the SOE 200. Accordingly, laser feedback loop is formed between the high reflectivity facet of the SOE 200 and the CDG 1310 and the lasing wavelength is determined by the rotation of the CDG 1310.

In contrast to the preceding R-MEMS within FIGS. 4 to 12 the R-MEMS 1320 rotates in conjunction with a second R-MEMS 1330 wherein the R-MEMS 1320 is rotating along the Rowland circle, the CDG 1310 too and the R-MEMS 1320 is also rotating within the second R-MEMS 1330 which also rotates. The second R-MEMS 1330 rotates around the point between the channel waveguide 260 and the planar waveguide 1350 within the R-MEMS 1320. Accordingly, the double MEMS allows for control of both the position of the input beam along the Rowland circle and its incidence angle on the CDG 1310. It would be evident that continuous tuning of the lasing wavelength is possible. Accordingly, within PIC 1300 an opening 1340 allows for rotation of the second R-MEMS 1330.

Figure 14:
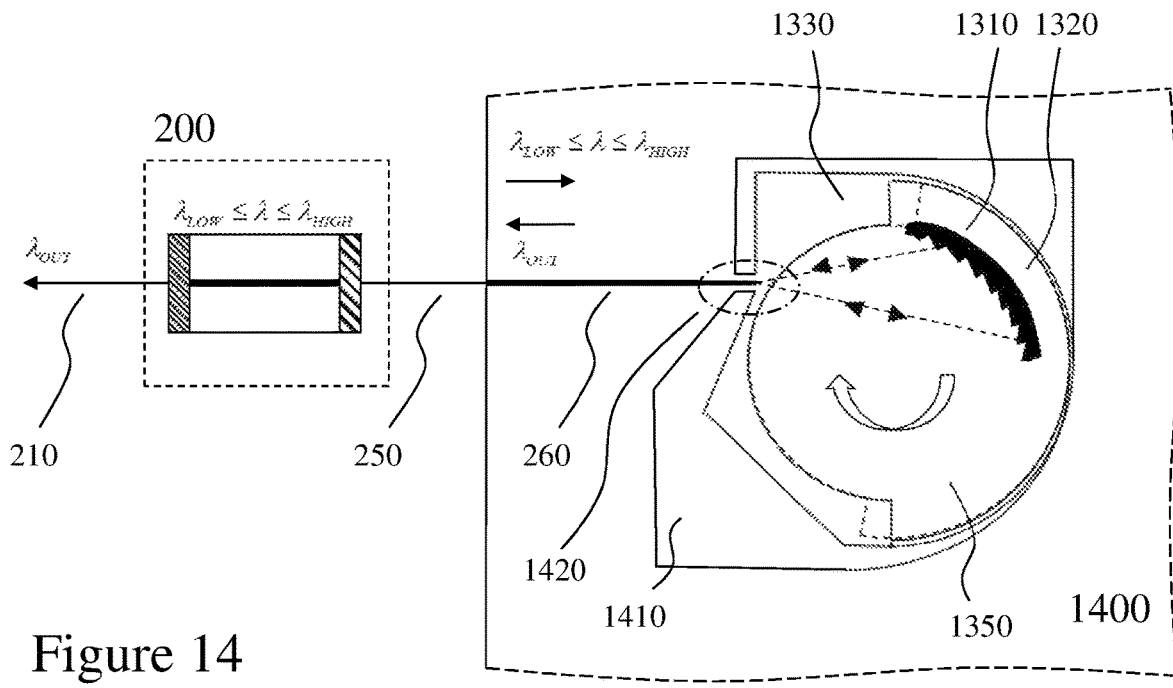
FIG. 14 depicts a TOS exploiting a double rotating MEMS with an integrated CDG in a Littrow configuration according to an embodiment of the invention.

Referring to FIG. 14 there is depicted a TOS exploiting a double rotating MEMS with an integrated CDG in a Littrow configuration according to an embodiment of the invention with a similar construction to that depicted in FIG. 13. However, rather than the channel waveguide 260 coupling to the planar waveguide upon the first R-MEMS 1320 the channel waveguide 260 couples to a planar waveguide portion that attaches the R-MEMS 1330 to the portion of the PIC 1400 with the channel waveguide. This being identified as region 1420 in FIG. 14.

Figure 15:
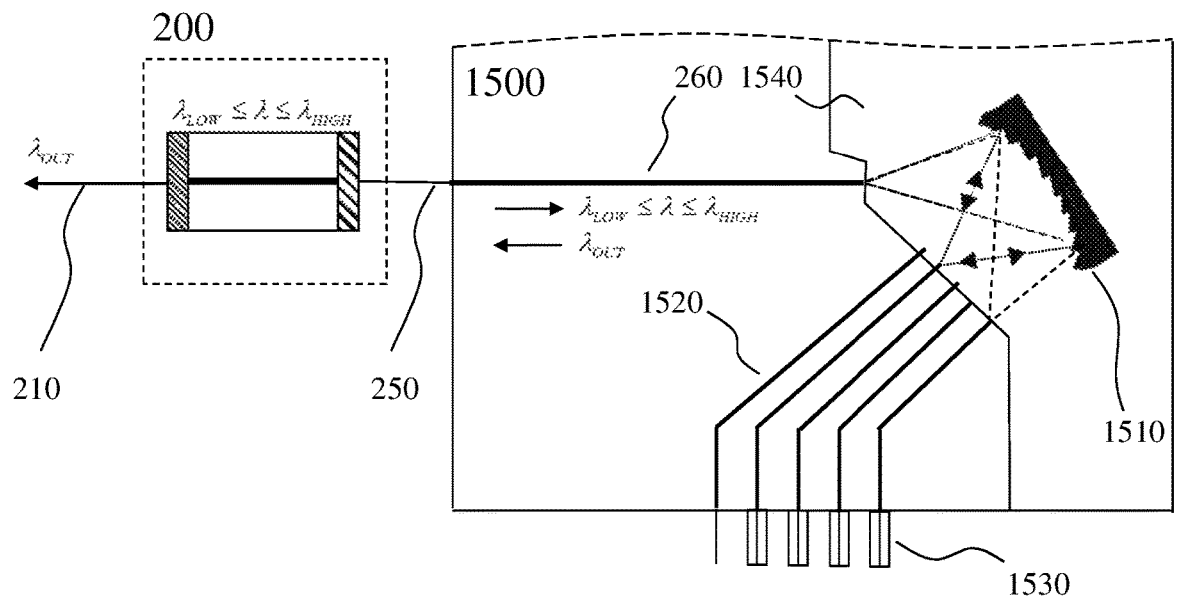
FIG. 15 depicts a TOS exploiting a CDG with MEMS based controlled reflectors according to an embodiment of the invention.

Now referring to FIG. 15 there is depicted a TOS exploiting a CDG with MEMS based controlled reflectors according to an embodiment of the invention. Accordingly, as depicted a PIC 1500 is coupled to a SOE 200 via an optical fiber 250 wherein the optical signals initially couple to a channel waveguide 260 which couples to a planar waveguide 1540 wherein the beam expands in the planar waveguide 1540, is retro-diffracted by the CDG 1510, propagates in the planar waveguide 1540, and focuses onto the rib waveguides 1520. The optical signals within the rib waveguides 1520 are then coupled to external variable reflectors 1530. Signals reflected from the variable reflectors 1530 then follow the reverse path to the SOE 200. Optionally, only one variable reflector 1540 reflects providing a single emission wavelength. However, it would be evident that multiple variable reflectors 1540 may reflect fully or partially to yield a programmable multi-wavelength optical source. Optionally, the variable reflectors 1540 may be integrated into the PIC 1500 through MEMS elements, for example, wherein the MEMS elements are the reflective element or block the reflective element. Optionally, the CDG 1510 may be replaced by another optical wavelength demultiplexer such as an arrayed waveguide grating (AWG) for example.

Figure 16:
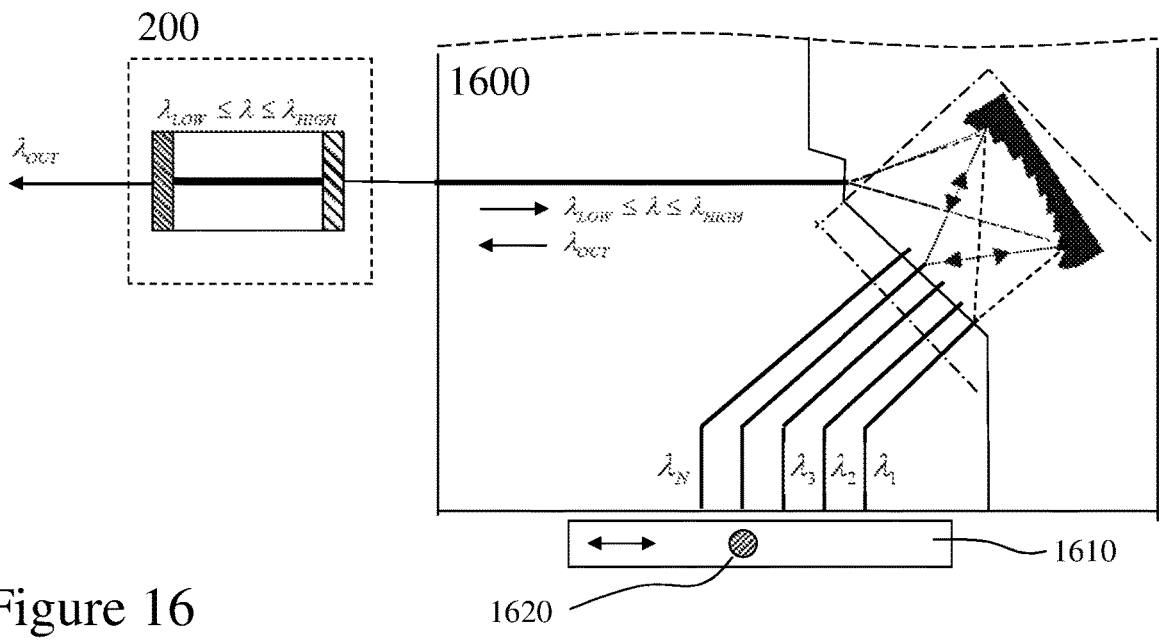
FIG. 16 depicts a TOS exploiting a CDG with a linear MEMS based reflector according to an embodiment of the invention.
Figure 17:
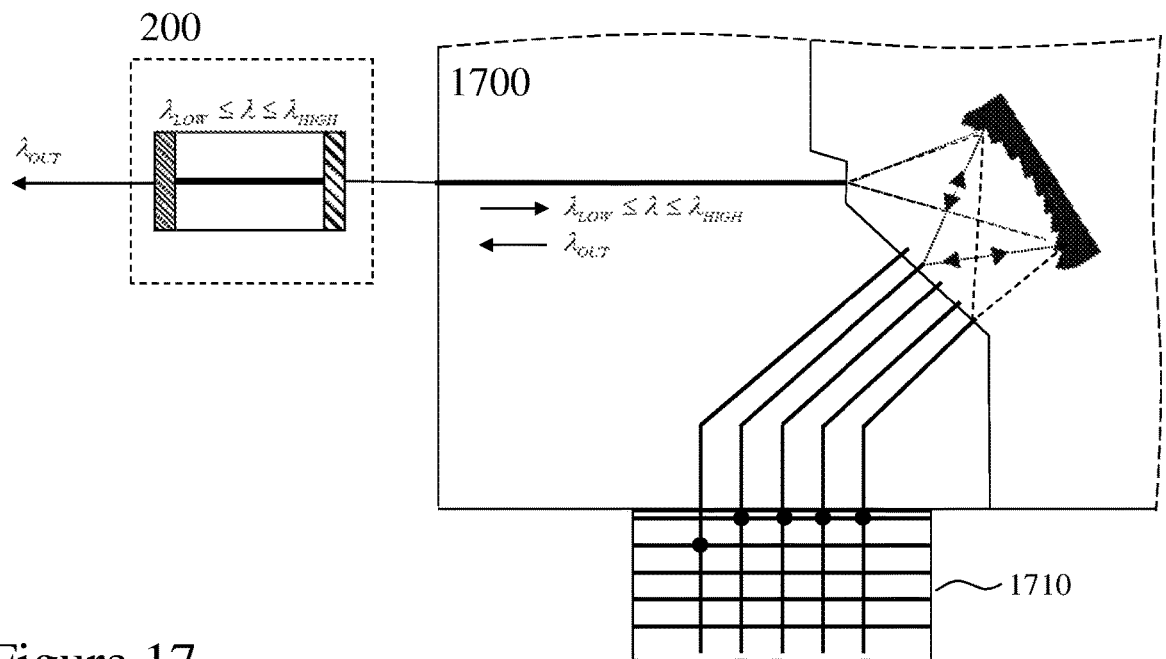
FIG. 17 depicts a TOS exploiting a CDG with a digital microfluidics mirror according to an embodiment of the invention.
Figure 18:
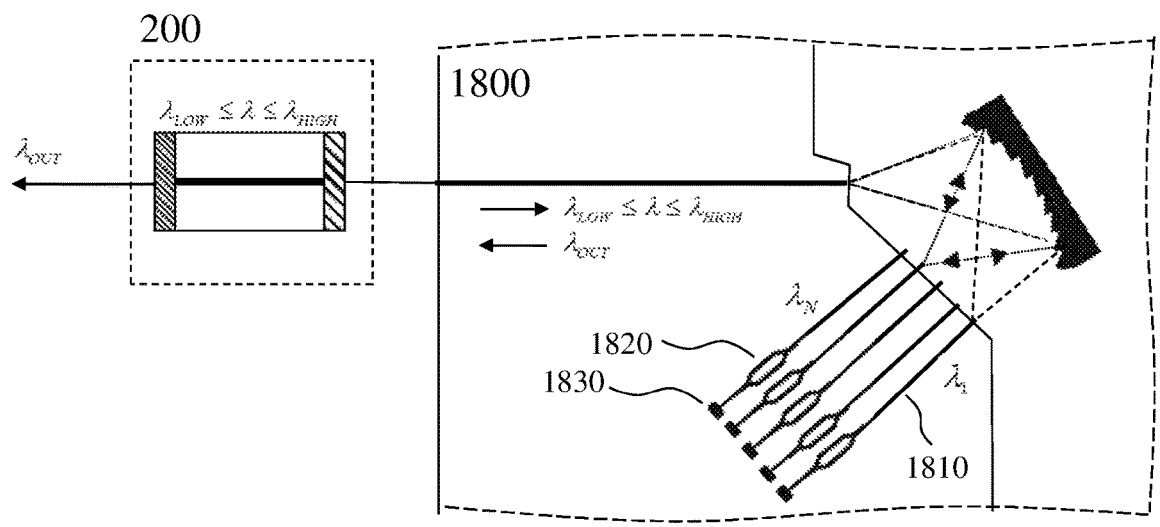
FIG. 18 depicts a TOS exploiting a CDG with a waveguide switch based selective mirror according to an embodiment of the invention.

Referring to FIGS. 16 to 18 there are depicted variants of the TOS depicted in FIG. 15. Accordingly, within these the PIC 1500 is replaced by PICs 1600 to 1800 wherein the plurality of variable reflectors 1530 are replaced by:
PIC 1600 with linear MEMS actuator 1610 with reflective element 1620;
PIC 1700 with digital microfluidics mirror 1710 wherein either the absence or presence of a fluidic droplet at the PIC edge results in reflection of the optical signals within the waveguide with which each fluidic droplet is associated; and
PIC 1800 with waveguide based reflectors comprising Mach-Zehnder modulators 1820 within waveguides 1810 that either allow or block the optical signals impinging each mirror 1830 associated with a waveguide 1810.

Figure 19:
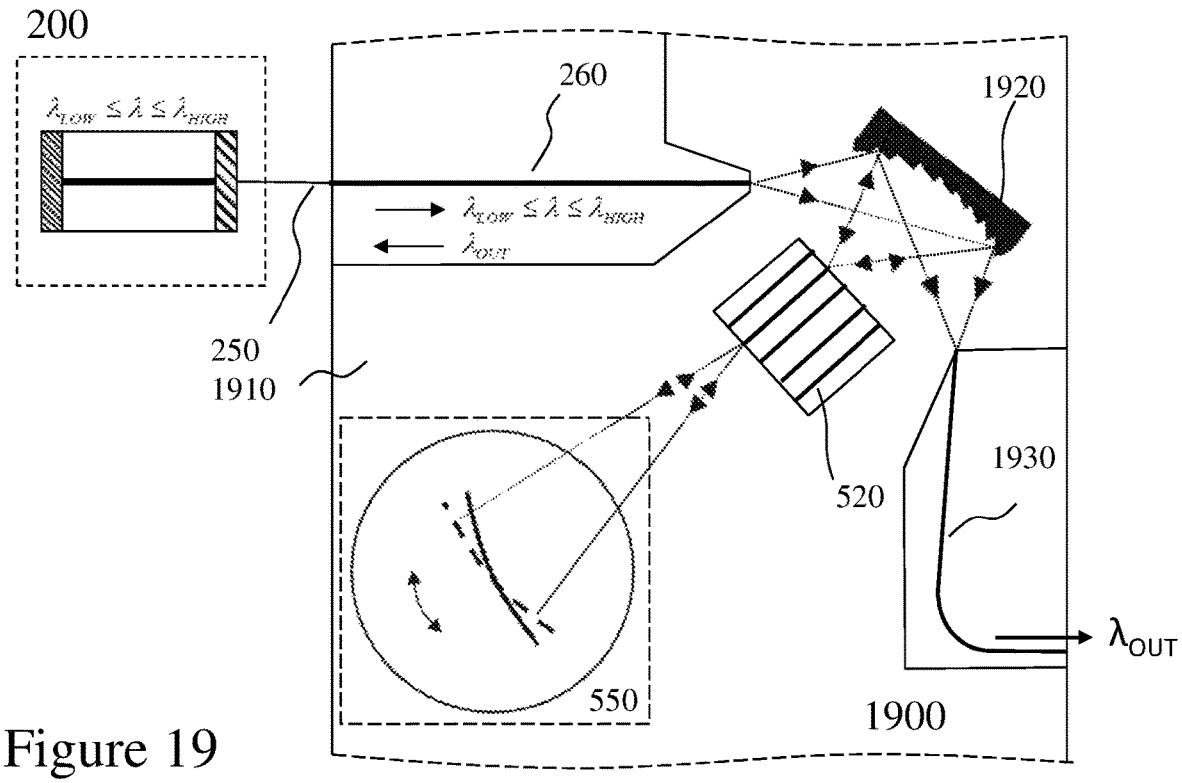
FIG. 19 depicts a TOS exploiting a CDG in conjunction with channel waveguides and an R-MEMS based mirror in a Littman-Metcalf configuration according to an embodiment of the invention.

FIG. 19 depicts a TOS exploiting a CDG in conjunction with channel waveguides and an R-MEMS based mirror in a Littman-Metcalf configuration according to an embodiment of the invention. Accordingly, as depicted a PIC 1900 is coupled to a SOE 200 via an optical fiber 250 wherein the optical signals initially couple to a channel waveguide 260 which terminates at a planar waveguide 1910. PIC 1900 being a variant of PIC 900 in FIG. 9 wherein the CDG 1920 is operating in the Littman-Metcalf configuration. Accordingly, the optical signals reflected from the mirror within the R-MEMS 550 to the CDG 1920 are coupled to the output waveguide 1930.

Figure 20:
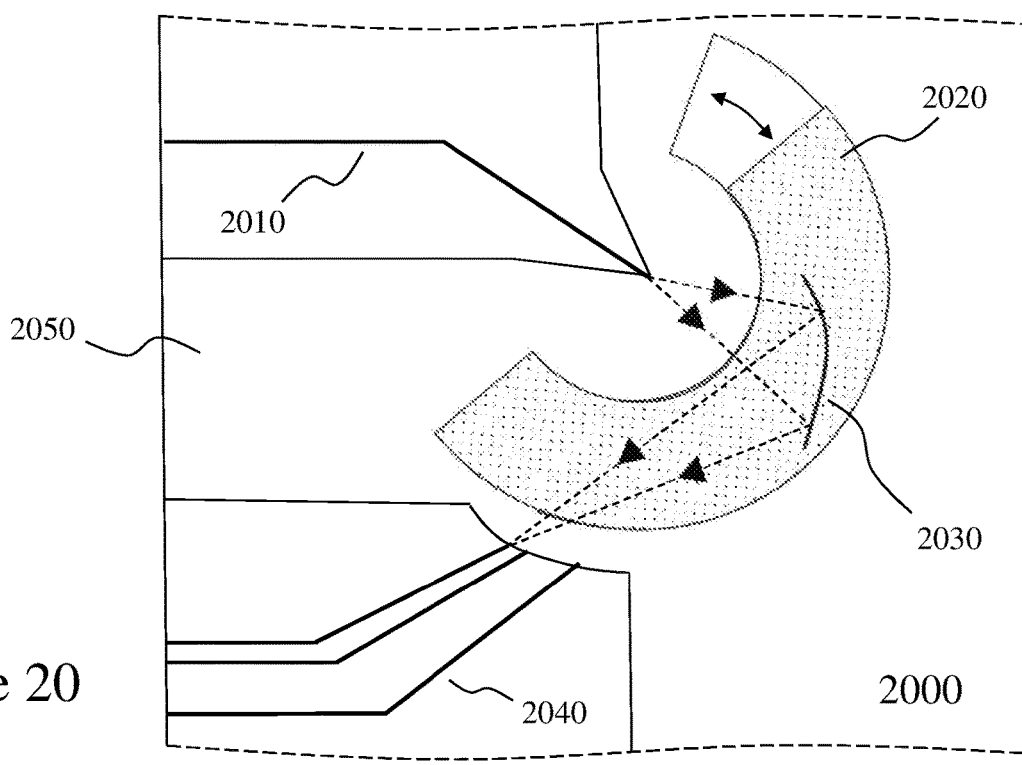
FIG. 20 depicts an R-MEMS based mirror according to an embodiment of the invention.

Now referring to FIG. 20 there is depicted an R-MEMS based mirror according to an embodiment of the invention which may form the basis of MOEMS based 1:N or N:1 optical switching elements for example. Accordingly, as depicted a PIC 2000 comprises, considering a 1:N optical switching functionality, an input optical waveguide 2010 that couples to a planar waveguide 2050 within which is formed R-MEMS 2020 which has mirror 2030 formed within it such that the optical signals propagate to the selected output waveguide 2040. Accordingly, rotation of the R-MEMS 2020 tilts the mirror 2030 such that the input optical waveguide 2010 is selectively coupled to one of the output waveguides 2040. The end of the input optical waveguide 2010 is positioned at the focal point of an ellipse upon which the mirror 2030 is based. Accordingly, as the R-MEMS 2020 rotates around this focal point the ends of the output waveguides 2040 are disposed at second focal points of the ellipse defining the mirror.

This allows the elliptical mirror 2030 to always receive light from its focal point and to refocus it back at its second focal point. The second focal point position being a circle centered on the first focal point when the R-MEMS 2030 platform rotates. By positioning waveguides at these different positions, it is therefore possible to redirect from the input channel waveguide into the different output channel waveguides by moving a step. The channel waveguides are substantially oriented along the central line of beam. The output channel is thus selected by the R-MEMS 2030 platform rotation angle. The output channel waveguides may couple to other PIC circuit elements, optical fibers, etc. within different implementations. Optionally, the elliptical mirror 2020 may be slightly distorted in order to account for aberrations in focusing or stigmatism.

Figure 21:
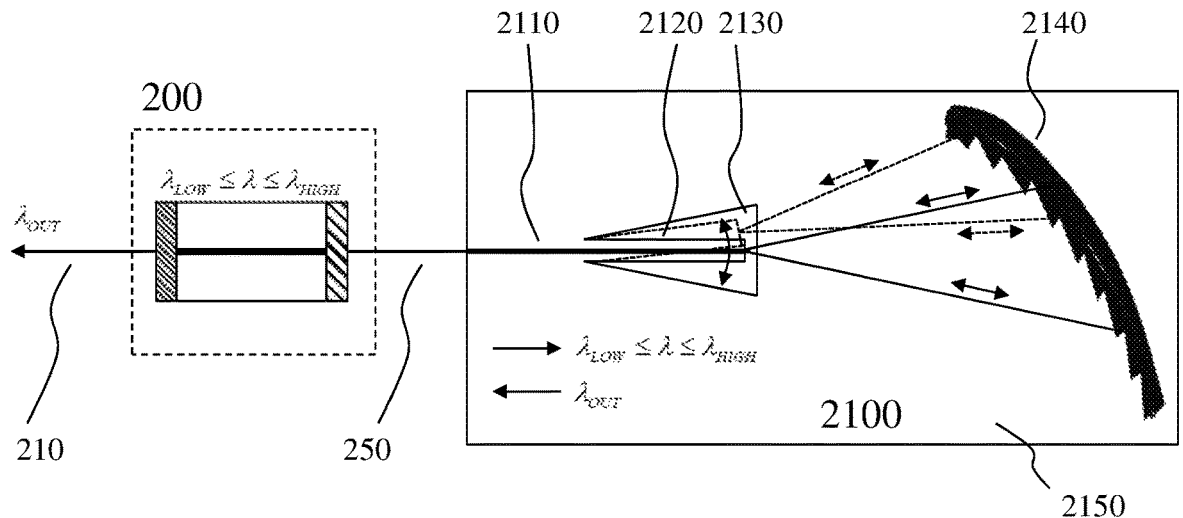
FIGS. 21 and 22 depict a schematic and three-dimensional perspective view of a TOS exploiting an R-MEMS mirror with a CDG and planar waveguides according to an embodiment of the invention.
Figure 22:
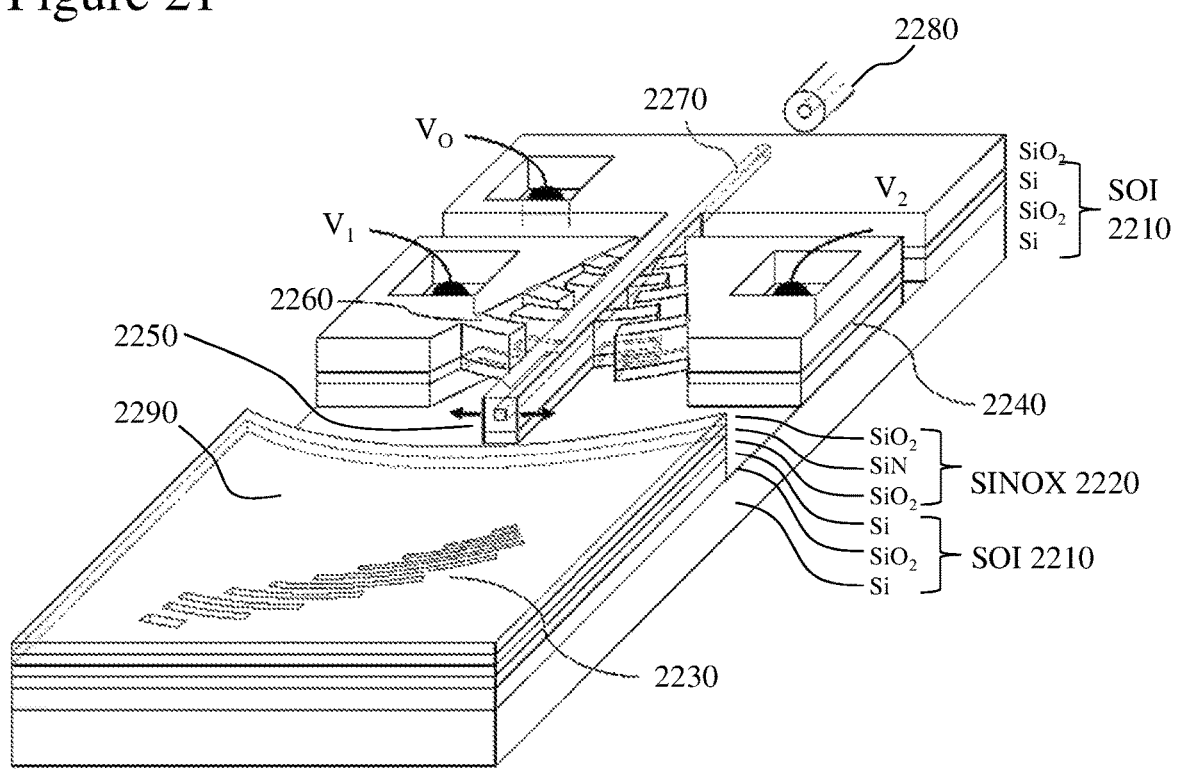

Now referring to FIGS. 21 and 22 there are depicted a schematic and three-dimensional perspective view of a TOS exploiting an R-MEMS mirror with a CDG and planar waveguides according to an embodiment of the invention. Accordingly, as depicted a PIC 2100 is coupled to a SOE 200 via an optical fiber 250 wherein the optical signals initially couple to a channel waveguide 2110. The channel waveguide 2110 then propagates within a "rib" waveguide section 2120 which terminates at a facet in front of a planar waveguide 2150 within which is disposed a CDG such as described and depicted supra in respect of other embodiments of the invention. The "rib" waveguide forms part of a MEMS which rotates the "rib" waveguide 2120 with respect to the planar waveguide 2150. The optical beam within the planar waveguide 2150 expands within the planar waveguide 2150 and is then retro-diffracted by the CDG 2140 used in Littrow configuration. The retro-diffracted optical signals propagate back whilst being focused onto the end facet of the "rib" waveguide 2120 light and therein back through the channel waveguide 2110, optical fiber 250, SOE 200, and to the remainder of the optical system via input fiber 210.

Accordingly, the device operates as a tunable optical source wherein the broadband emission of the SOE 200 is coupled to the CDG 2140 which defines the retro-diffracted wavelength based upon the coupled signal from the "rib" waveguide 2120. The retro-diffracted signal there provides the optical feedback loop between the SOE 200 and CDG 2140. Movement of the end facet of the "rib" waveguide 2120 within the etched opening 2130 under control of the MEMS provides for variation in the "selected" optical waveguide. The position of the CDG 2140 is defined such that its focal line is defined at the end facet of the "rib" waveguide. Continuous movement of the MEMS results in continuous tuning of the optical source.

Referring to FIG. 22 the PIC 2100 is depicted in three-dimensional perspective view. Accordingly, there is depicted the optical fiber 2280 coupled to the channel waveguide 2270 which transitions to the "rib" waveguide 2250. Within the embodiment of the invention depicted the channel waveguide 2270 is based upon a silicon-on-insulator (SOI) 2210 structure comprising a silicon (Si) substrate, silicon dioxide ($SiO_2$) lower cladding, silicon core, and $SiO_2$ upper cladding. The "rib" waveguide 2250 is disposed between first and second MEMS structures 2260 and 2240 respectively which can be biased at $V_1$ and $V_2$ respectively relative to the bias of the channel waveguide 2270/"rib" waveguide 2250 which is set at $V_0$. The "rib" waveguide 2250 and first and second MEMS structures 2260 and 2240 respectively having interleaving fingers allowing the "rib" waveguide 2250 to be rotated by the MEMS actuator under electrostatic attraction/repulsion as known in the prior art.

Disposed opposite a small air gap region is the planar waveguide 2290 which is formed from an underlying SOI 2210 planar waveguide region with a silicon nitride-silicon oxide (SINOX) overlay 2220 comprising a $SiO_2$—SiN—$SiO_2$ stack. The CDG being defined within the SiN layer for etching into the underlying $SiO_2$—Si—$SiO_2$—Si stack and then capped with the topmost $SiO_2$ layer. As depicted within FIG. 22 the facet of the planar waveguide 2290 opposite the end-face of the "rib" waveguide 2250 is curved such that as the MEMS actuator moves the end-face of the "rib" waveguide 2250 relative to the facet of the planar waveguide 2290 the separation is constant.

Figure 23:
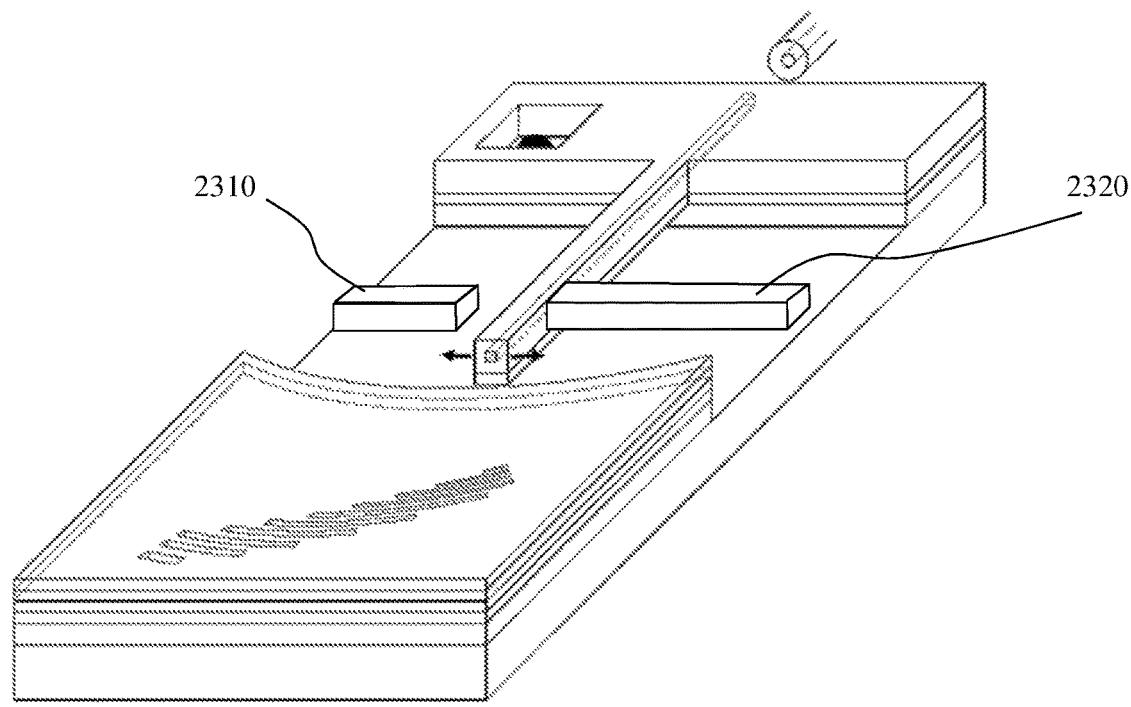
FIG. 23 depicts a three-dimensional perspective view of photonic integrated circuit comprising MEMS actuated "rib" waveguide launch to a planar waveguide and its associated CDG according to an embodiment of the invention.

Within another embodiment of the invention the optical waveguide upon the PIC 2100 may be a "rib" waveguide without a channel waveguide region. Optionally, the end of the optical waveguide coupled to the optical fiber 2280 may be tapered for improved mode coupling. Whilst a symmetric drive MEMS is depicted with electrostatic actuators disposed on either side it would be evident that optionally an asymmetric drive design may be employed with a single electrostatic actuator on one side of the "rib" waveguide. Referring to FIG. 23 there is depicted an alternate design wherein the central "rib" waveguide is free-standing and is contact by either of the first and/or second linear MEMS actuator arms 2310 and 2320 respectively, which according to their electrostatic drive push the "rib" waveguide in one direction or the other whilst the other MEMS actuator arm either is not in contact or is in contact to limit motion of the "rib" waveguide under mechanical shock and/or vibration. Optionally, a single MEMS actuator may be employed wherein the "rib" waveguide is deflected under the action of the single MEMS actuator and the elastic "spring-like" nature of the "rib" waveguide maintains the waveguide in contact with the actuator and seeks to return to the default position.

It would be evident to one of skill in the art that within the descriptions supra in respect of FIGS. 2 to 22 and the associated drawing that many features have been omitted for clarity and simplicity of the descriptions and figures. Such elements may include, but not be limited to, springs, torsion elements, attachments, etc. together with linear and/or rotary actuators such as those exploiting thermal effects, e.g. deformation by heating, or electrostatic effects, e.g. comb actuators.

Figure 24:
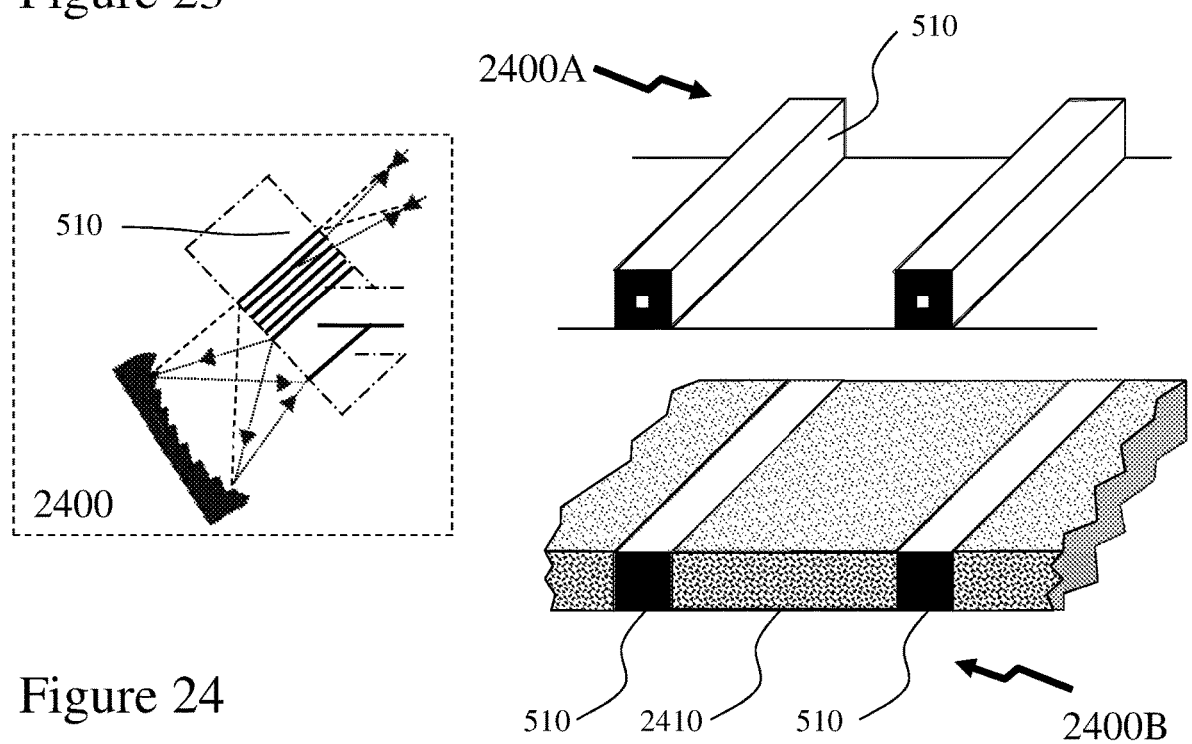
FIG. 24 depicts absorber elements disposed between channel waveguides as employed within embodiments of the invention described in respect of FIGS. 2 to 20 respectively.

Within FIGS. 2 to 20 described supra embodiments of the invention may employ a plurality of filter waveguides, each being a short waveguide region or what may be referred to as a stub waveguide although it would be evident that the waveguides may be longer and/or curved etc. as required to configure the device to the desired footprint discretely or in combination with other optical circuit elements. Now referring to FIG. 24 there is depicted a portion of PIC 500 as inset 2400 with these channel waveguides 510 which is also depicted as first schematic 2400A wherein the waveguides 510 are disposed as discrete structures atop the substrate. However, at R-MEMS angles that do not couple to one of the channel waveguides 510 there is no control of the optical signals which may in some instances lead to optical crosstalk and/or poor isolation within the device. Accordingly, as depicted within second schematic 2400B the region between adjacent channel waveguides 510 has been filled with a material 2410. Material 2410 may be absorbing over the operating range of the PIC such that optical signals coupled into the material 2410 are absorbed thereby increasing isolation and/or crosstalk performance.

Within the embodiments of the invention described supra in respect of FIGS. 2 to 24 the channel waveguides have been depicted as straight waveguides however it would be evident that these may be curved waveguides as well as combined straight-curved waveguide geometries as the R-MEMS and CDG are essentially decoupled in physical positions via the plurality of channel waveguides. Accordingly, the position of the CDG may be established relative to the substrate, the R-MEMS and any other photonic circuit/electronic circuit/MEMS elements as chosen by the designer. For example, the design constraint may be manufacturing process derived such that a particular orientation enhances CDG facet fabrication, for example, of that folding the CDG adjacent the R-MEMS allows enhanced CMOS integration, for example.

The Figures themselves are simplified schematics intend to provide a visual representation of embodiments of the invention but are not intended to be accurate in respect of dimensions, angles, distances, relative positions, geometries etc. Further, for devices exploiting Rowland configurations, the schematics may not necessarily appear to be on the Rowland circle or with the precise orientation.

Some of the configurations described in respect of FIGS. 2 to 22 may be configured through slight alterations to operate in transmissive mode rather than the depicted reflection mode. This means that a selectable wavelength be transmitted through the device rather than being reflected back. For example, to do this, the reflectors could be removed, leaving the selected wavelength go through.

The curved diffraction gratings (CDGs) described herein are based on the Rowland configuration. This configuration can modified to address other needs such as providing a different focal line. This could, for example, be to simplify the layout by replacing a double platform by a single platform, while providing the same functionality. The CDGs may be replaced by another optical element realizing the same optical functionality, i.e. different wavelengths from one or several inputs into different outputs. The inputs/outputs can be within different embodiments of the invention, channel (rib) waveguides, focal points, or apertures. The separation can be discontinuous (e.g. into channels such as those within CWDM/DWDM systems including International Telecommunications Union standards, or continuous (e.g. spectrum spread in spectrometry). Examples of such devices may include AWG wherein rotation of the AWG leads to coupling of the optical channel input waveguide to a different launch waveguide within the AWG or other MUX/DEMUX optical elements.

Configurations described and depicted within FIGS. 15 to 18 respectively may also operate with the CDG in the Littman-Metcalf configuration. The CDG used in a classical dispersive way would be replaced by a Littman-Metcalf CDG, in the same way as it is used in respect of the embodiment of the invention depicted and described with respect to FIG. 19 which would allow the optical signals to be coupled to a waveguide within the respective PICs rather than an optical fiber coupled to the SOE and its gain medium.

Optionally, the CDG may be an elliptical Bragg mirror diffraction grating, a classic diffraction grating with reflective facets (e. g. metallized), or any other type of diffraction grating. The use of an elliptical Bragg mirror diffraction grating can provide more reflection (by diffracting back mainly one order of diffraction).

Within the embodiments of the invention described and depicted in respect of FIGS. 2 to 19 and 21-22 a PIC is coupled via an optical fiber to an SOE. However, within other embodiments of the invention the SOE may be butt-coupled to the PIC or hybrid integrated with butt-waveguide coupling or evanescent wave coupling between the PIC and SOE as known within the prior art. For example, a PIC may exploit silica-on-silicon ($SiO_2$-on-Si) with an indium phosphide (InP) based SOE. Optionally, the SOE may be functionally split between a semiconductor die, e.g. a semiconductor optical amplifier, with a high reflectivity coating formed on facet of the PIC or within a waveguide. Optionally, embodiments of the invention with respect to the PIC may instead of $SiO_2$-on-Si exploit silicon nitride ($Si_3N_4$-on-Si), silicon-on-insulator (SOI), silicon oxynitride on silicon ($SiO_XN_Y$-on-Si), or polymer on silicon technologies. Optical sources may exploit different semiconductor material systems according to the wavelength of operation. Within such material systems a planar (slab or 2D) waveguide may be implemented via a lower cladding-core-upper cladding or lower cladding-core-air waveguide structure wherein the additional provisioning of a rib upon the upper surface provides for rib-loading of the planar waveguide and accordingly the provisioning of a channel (rib or 3D) waveguide. The CDG may thereby be formed by etching the facets of the CDG into the planar waveguide and metallizing them.

Within FIG. 22 the material system depicted is of a common SOI based waveguide—MEMS structure comprising Si—$SiO_2$—Si—$SiO_2$ wherein the lower Si is the substrate, the lower $SiO_2$ the sacrificial layer for releasing the MEMS, the second Si forms the lower mechanical layer of the MEMS and the upper cladding $SiO_2$ the cladding for the channel waveguide/"rib" waveguide. It would therefore be evident that other mechanical layers for the MEMS other than Si may be employed without departing from the scope of the invention. Such MEMS mechanical layers may include, but are not limited to, silicon carbide (SiC), silicon nitride ($Si_3N_4$), silicon dioxide ($SiO_2$), aluminum nitride (AlN), alumina ($Al_2O_3$), zirconia ($ZrO_2$), and diamond (C).

It would be evident that rather than forming wavelength tunable optical sources the PICS may form the basis of other optical components including, but not limited to, wavelength filters, wavelength tunable optical detectors, and wavelength tunable add/drop modules. For example, replacement of the SOE in reflective designs with a circulator and photodetector provides for wavelength tunable optical detectors whilst absent the photodetector it is a wavelength tunable filter.

Whilst within the embodiments of the invention described and depicted supra in respect of FIGS. 2 to 22 the R-MEMS and/or MEMS is depicted as a discrete element it would be evident to one of skill in the art that additional elements may be provided according to embodiments of the invention. For example, in order to remove the requirement for maintaining electrical power to the MEMS during operation one or more latching elements may be associated with the R-MEMS and/or MEMS element.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A photonic circuit comprising:
   a substrate;
   a rotatable microelectromechanical system (R-MEMS) element with a planar waveguide upon the upper surface and having a mirror formed therein;
   a channel waveguide supporting propagation of optical signals within a predetermined wavelength range coupled to the R-MEMS element; and
   a reflective diffraction grating, wherein
   rotation of the R-MEMS results in optical signals within a predetermined subset of the predetermined wavelength range being either:
   coupled back to the channel waveguide after they have been reflected from the mirror, coupled to the reflective diffraction grating, and reflected again by the mirror;
   or
   coupled to another channel waveguide after they have been reflected from the mirror, coupled to the reflective diffraction grating, and reflected by the reflective diffraction grating.

2. The photonic circuit according to claim 1, wherein the reflective diffraction grating and mirror are disposed on opposite sides of a common focal point.

3. The photonic circuit according to claim 1, further comprising a plurality of filter waveguides disposed between the mirror and the reflective diffraction grating; wherein the optical signals coupled to the mirror from the channel waveguide are initially coupled to an end of a predetermined filter waveguide of the plurality of filter waveguides and then coupled to the reflective diffraction grating from a distal end of the predetermined filter waveguide of the plurality of filter waveguides.

4. The photonic circuit according to claim 3, wherein the signals reflected from the reflective diffraction grating coupled from a predetermined filter waveguide of the plurality of filter waveguides are coupled to another channel waveguide; and the signals coupled to the another channel waveguide are coupled to the mirror.

5. The photonic circuit according to claim 3, wherein the signals reflected from the reflective diffraction grating from a predetermined filter waveguide of the plurality of filter waveguides are coupled to another channel waveguide and thereafter a reflector such that the optical signals within the another channel waveguide are reflected back to the reflective diffraction grating and thereafter to the channel waveguide via the mirror.

6. The photonic circuit according to claim 3, wherein the signals reflected from the reflective diffraction grating from a predetermined filter waveguide of the plurality of filter waveguides are coupled to another channel waveguide and thereafter from the another channel waveguide to the channel waveguide via the mirror.

7. The photonic circuit according to claim 5, wherein the reflector is a distributed feedback grating.

8. The photonic circuit according to claim 5, further comprising a semiconductor optical amplifier (SOA) coupled at a first end to an optical output port via a first high reflectivity facet of the SOA and a second distal end coupled via second low reflectivity facet of the SOA to the channel waveguide; wherein the R-MEMS element and the reflective diffraction grating provide a wavelength selective high reflectivity external cavity for the SOA.

9. The photonic circuit according to claim 3, wherein the signals reflected from the reflective diffraction grating from a predetermined filter waveguide of the plurality of filter waveguides are coupled to another predetermined filter waveguide of the plurality of filter waveguides and thereafter from the another predetermined filter waveguide of the plurality of filter waveguides to the channel waveguide via the mirror.

\* \* \* \* \*